United States Patent
Ozoe et al.

(10) Patent No.: US 9,117,494 B2
(45) Date of Patent: Aug. 25, 2015

(54) SENSE AMPLIFIER CIRCUIT AND SEMICONDUCTOR MEMORY DEVICE

(71) Applicant: Renesas Electronics Corporation, Kawasaki-shi, Kanagawa (JP)

(72) Inventors: Hidetoshi Ozoe, Yokohama (JP); Yasuhiro Tonda, Yokohama (JP); Kazutaka Taniguchi, Yokohama (JP)

(73) Assignee: RENESAS ELECTRONICS CORPORATION, Kanagawa (JP)

( * ) Notice: Subject to any disclaimer, the term of this patent is extended or adjusted under 35 U.S.C. 154(b) by 136 days.

(21) Appl. No.: 13/774,975

(22) Filed: Feb. 22, 2013

(65) Prior Publication Data

US 2013/0223164 A1 Aug. 29, 2013

(30) Foreign Application Priority Data

Feb. 24, 2012 (JP) ................................. 2012-038511

(51) Int. Cl.
| | |
|---|---|
| G11C 7/00 | (2006.01) |
| G11C 7/06 | (2006.01) |
| G11C 16/28 | (2006.01) |
| G11C 16/04 | (2006.01) |

(52) U.S. Cl.
CPC ........... *G11C 7/06* (2013.01); *G11C 7/062* (2013.01); *G11C 16/28* (2013.01); *G11C 16/0416* (2013.01)

(58) Field of Classification Search
USPC ...................... 365/189.011, 185.21, 205, 207
See application file for complete search history.

(56) References Cited

U.S. PATENT DOCUMENTS

2009/0161436 A1* 6/2009 Abiko et al. ............. 365/185.17
2009/0268538 A1* 10/2009 Fukushima ................... 365/208

FOREIGN PATENT DOCUMENTS

JP 2009-181599 A 8/2009

* cited by examiner

*Primary Examiner* — Anthan Tran
(74) *Attorney, Agent, or Firm* — McDermott Will & Emery LLP

(57) ABSTRACT

To improve reading accuracy of a sense amplifier circuit and a semiconductor memory device. A sense amplifier circuit includes an N type FET which is a sensing transistor connected between a power supply and a ground via a data line that extends to a memory cell, a resistance element that is connected between a gate of the sensing transistor and the power supply, and a capacitance element that is connected between the gate of the sensing transistor and the ground.

12 Claims, 20 Drawing Sheets

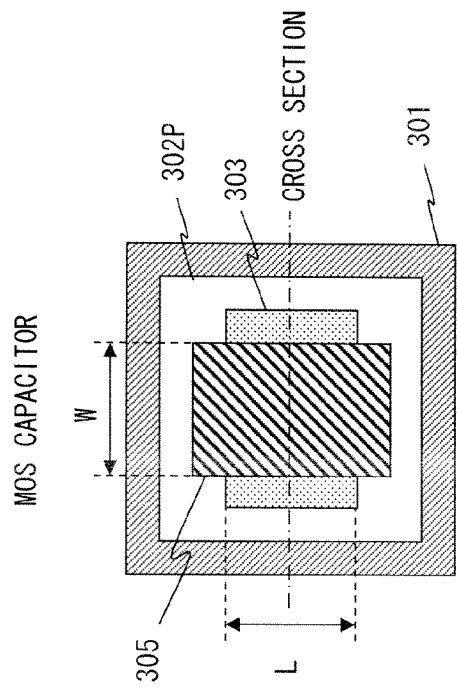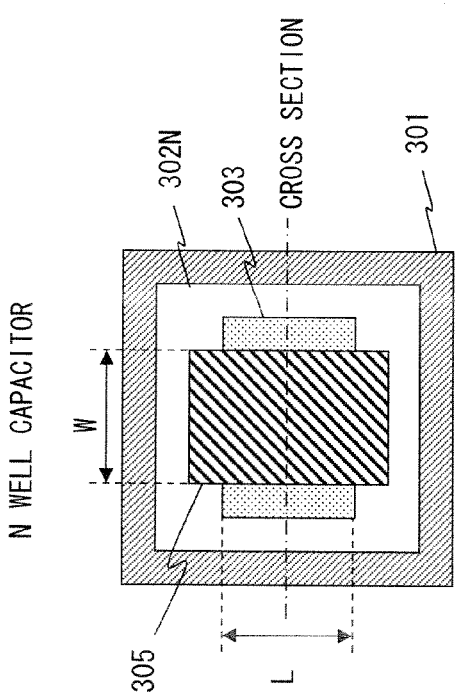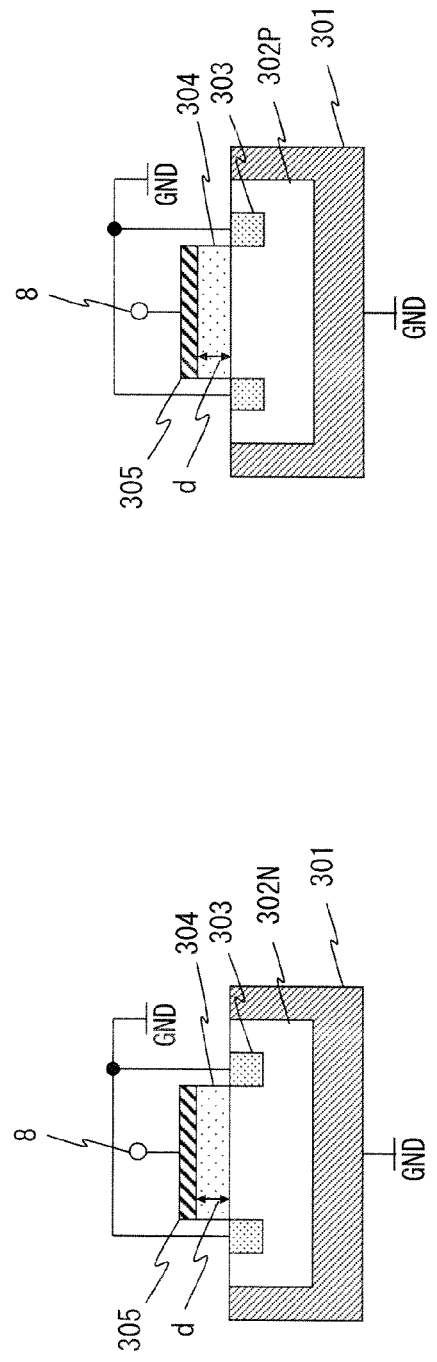
Fig. 3A
Fig. 3B

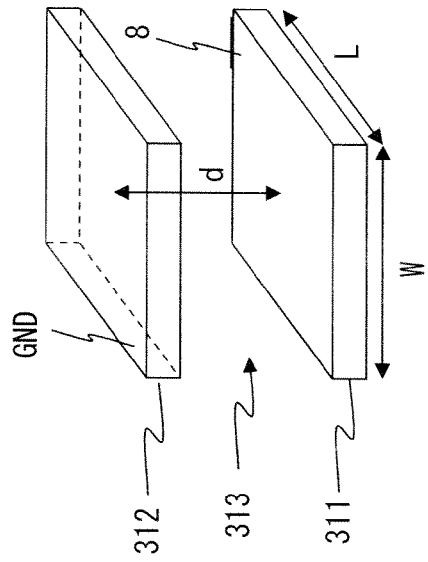
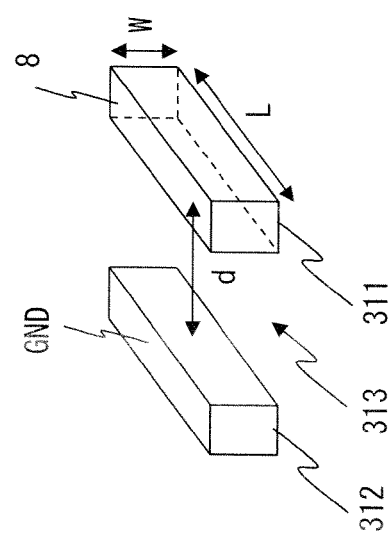
Fig. 4A
Fig. 4B

| STANDBY CONTROL TERMINAL 7 (VSTB) | MODE SWITCH CONTROL TERMINAL 10 (VMODE) | CONTACT 3 (VCTL) | OPERATION STATE |
|---|---|---|---|
| 0V | 0V | VCC | LOW-SPEED READING MODE |
| 0V | VCC | POTENTIAL OBTAINED BY INVERTING AND AMPLIFYING DATA LINE 2 | HIGH-SPEED READING MODE |
| VCC | 0V | 0V | STANDBY |
| VCC | VCC | 0V | STANDBY |

Fig. 14

SENSE AMPLIFIER CIRCUIT AND SEMICONDUCTOR MEMORY DEVICE

CROSS-REFERENCE TO RELATED APPLICATIONS

This application is based upon and claims the benefit of priority from Japanese patent application No. 2012-038511, filed on Feb. 24, 2012, the disclosure of which is incorporated herein in its entirety by reference.

BACKGROUND

The present invention relates to a sense amplifier circuit and a semiconductor memory device. For example, the present invention can be suitably used for a sense amplifier circuit and a semiconductor memory device that include a sensing transistor.

In recent years, the applications of microcomputer products that are semiconductor devices including memories such as flash memories have expanded to low-cost electronic apparatuses in addition to high-performance electronic apparatuses. The size of chips has been decreasing in the market of low-cost electronic apparatuses where cost is the primary concern.

As the size of each chip of the semiconductor device decreases, a power supply and a ground capacity inside the chip relatively decreases as well. This causes degradation of noise immunity for noise that is generated in the power supply and a ground potential. In particular, since the standardization of Electro Magnetic Susceptibility (EMS) has been promoted, it is required to improve noise immunity.

As an example of such a semiconductor device, Japanese Unexamined Patent Application Publication No. 2009-181599 discloses a semiconductor memory device that includes a related sense amplifier circuit.

SUMMARY

One embodiment is based on a fact that a sense amplifier circuit in a semiconductor memory device is particularly sensitive to noise among circuits used in a semiconductor device.

More specifically, the sense amplifier circuit determines a signal level according to a current flowing through a memory cell to read out stored data. Accordingly, when being influenced by noise, the sense amplifier circuit may not be able to normally determine the signal level and may erroneously read stored data "0" in place of "1", or vice versa.

Accordingly, one problem in the related sense amplifier circuit as disclosed in Japanese Unexamined Patent Application Publication No. 2009-181599 is that it is susceptible to noise, which causes degradation of reading accuracy.

Other problems and novel characteristics will be made apparent from description of the specification and the accompanying drawings.

A sense amplifier circuit according to one embodiment includes: a sensing transistor that is connected between a first power supply and a second power supply through a memory cell connection line that extends to a memory cell; a resistance element that is connected between the first power supply and a control terminal of the sensing transistor; and a capacitance element that is connected between the second power supply and the control terminal of the sensing transistor.

A sense amplifier circuit according to another embodiment includes: a first transistor and a second transistor that are connected in series between a first power supply and a data line; an output inverter that is connected by a path including an intermediate node between the first transistor and the second transistor; a resistance element that is connected between the first power supply and a gate of the second transistor; and a capacitance element that is connected between a second power supply and the gate of the second transistor.

A semiconductor memory device according to another embodiment includes: a memory cell array including a plurality of memory cells arranged in array in a row direction and a column direction; a plurality of bit lines that extend in the column direction and are connected to the plurality of memory cells; and a plurality of sense amplifier circuits that are connected to the plurality of bit lines, in which each of the plurality of sense amplifier circuits includes: a sensing transistor that is connected between a first power supply and any one of the plurality of bit lines; a resistance element that is connected between the first power supply and a control terminal of the sensing transistor; and a capacitance element that is connected between a second power supply and the control terminal of the sensing transistor.

According to one embodiment, it is possible to improve reading accuracy of a sense amplifier circuit and a semiconductor memory device.

BRIEF DESCRIPTION OF THE DRAWINGS

The above and other aspects, advantages and features will be more apparent from the following description of certain embodiments taken in conjunction with the accompanying drawings, in which:

FIGS. 3A and 3B are diagrams each showing a configuration of a capacitance element of the sense amplifier circuit according to the first embodiment;

FIGS. 4A and 4B are diagrams each showing a configuration of a capacitance element of the sense amplifier circuit according to the first embodiment;

FIG. 14 is a truth table showing operation modes of the sense amplifier circuit according to the fifth embodiment;

DETAILED DESCRIPTION

Reference Example

Before describing embodiments, a reference example before applying the embodiments will be described.

Figure 18:
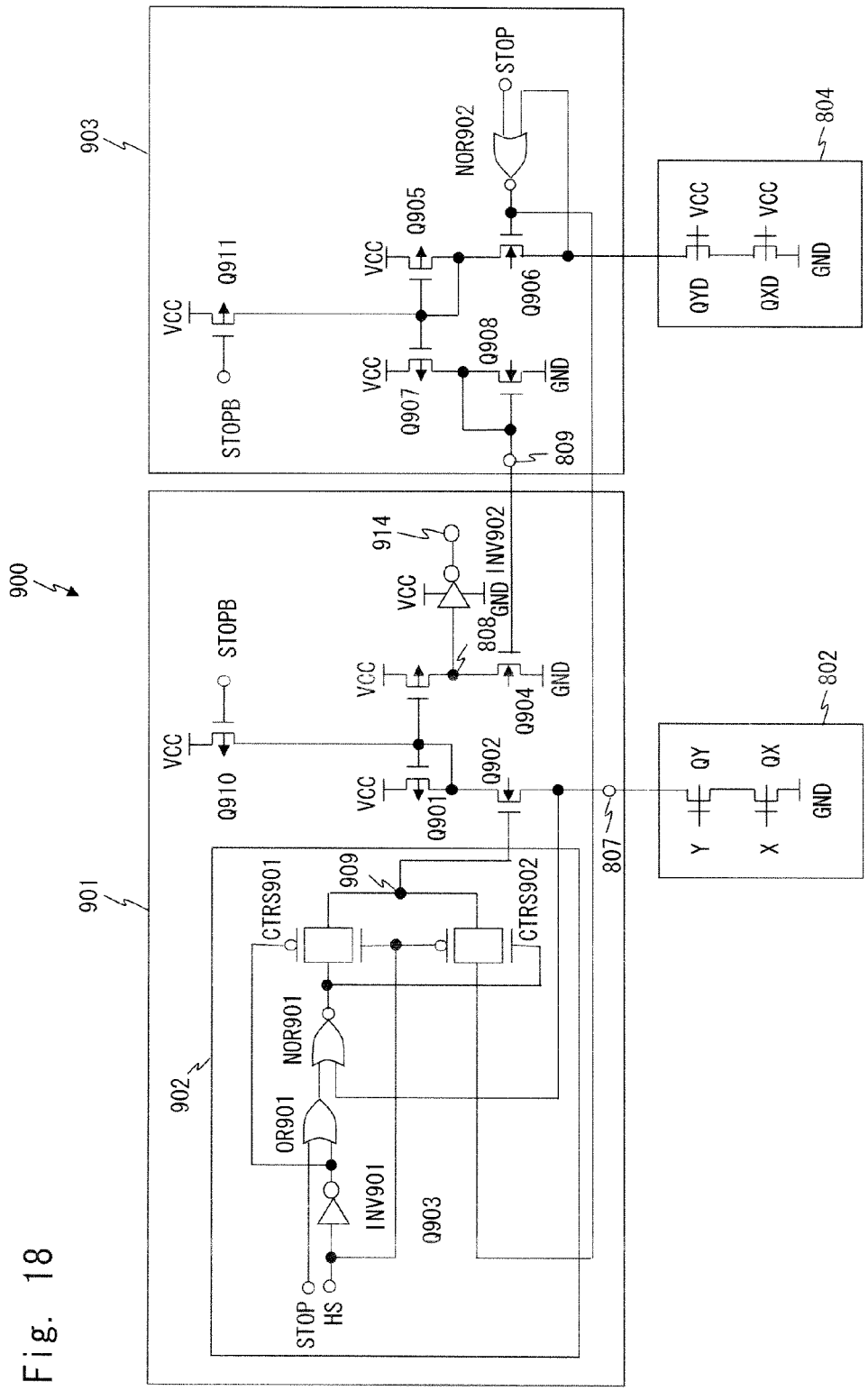
FIG. 18 is a circuit diagram showing a circuit configuration of a sense amplifier circuit according to a reference example.

FIG. 18 shows a configuration of a sense amplifier circuit 900 according to the reference example. The sense amplifier circuit 900 according to the reference example includes an inverter connected to an output terminal of the circuit disclosed in Japanese Unexamined Patent Application Publication No. 2009-181599.

The sense amplifier circuit 900 according to the reference example includes a sense circuit 901 that controls a voltage which is to be applied to a memory cell 802, and a reference voltage generation circuit 903 that supplies a reference voltage to the sense circuit 901.

A sense circuit 901 receives a signal STOP, a signal STOPB, and a mode switching signal HS.

The sense circuit 901 includes P type FETs (field effect transistors) Q901 and Q903 that form a current mirror circuit, an N type FET Q902, an N type FET Q904 having a gate connected to the reference voltage generation circuit 903 through a reference voltage output terminal 809, and a P type FET Q910 that forms a current source. The sense circuit 901 is connected to the memory cell 802 through a contact 807. Further, the sense circuit 901 is connected to an inverter INV902 through a contact 808.

The reference voltage generation circuit 903 includes a reference cell 804 having a configuration similar to that of the memory cell 802, P type FETs Q905 and Q907 that form a current mirror circuit, an N type FET Q906, an N type FET Q908 having a gate connected to the sense circuit 901 through the reference voltage output terminal 809, a P type FET Q911 that forms a current source, and a NOR gate NOR902.

Further, the sense amplifier circuit 900 according to the reference example includes a signal switching circuit 902, and the gate of the N type FET Q902 is connected to the signal switching circuit 902 through a contact 909.

The signal switching circuit 902 includes an inverter INV901, a two-input OR gate OR901, a two-input NOR gate NOR901, and transfer gates CTRS901 and CTRS902.

The two-input OR gate OR901 outputs a logical OR of the signal STOP and an inversion signal of the signal HS. The two-input NOR gate NOR901 outputs a negative OR of the output of the two-input OR gate OR901 and the contact 807.

The transfer gate CTRS901 controls connection between the output of the two-input OR gate OR901 and the contact 909. The transfer gate CTRS902 controls connection between the output of the two-input NOR gate NOR902 and the contact 909.

The sense amplifier circuit 900 according to the reference example reads out data stored in the memory cell 802 through the contact 807 (bit line) based on a current that flows through the memory cell 802 and a current that flows through the reference cell 804, and outputs the data to an output terminal 914 through the inverter INV902. At this time, the signal switching circuit 902 switches a high-speed operation mode and a low-speed operation mode according to the signal HS that is input. In the high-speed operation mode, it is possible to achieve a high-speed access to the memory cell 802. In the low-speed operation mode, low power consumption is achieved.

In the high-speed operation mode, the two-input NOR gate NOR901 (first feedback control circuit) in the signal switching circuit 902 controls ON/OFF of the N type FET Q902 according to a voltage of the contact 807, to control the voltage of the contact 807 (memory cell). Accordingly, in the high-speed operation mode, the amount of current of the N type FET Q902 is adjusted according to the amount of current that flows through the memory cell 802, and the amount of current of the N type FET Q906 is adjusted according to the amount of current that flows through the reference cell 804.

On the other hand, in the low-speed operation mode, the operation of the first feedback control circuit (NOR901) is stopped, and the two-input NOR gate NOR902 (second feedback control circuit) in the reference voltage generation circuit 903 controls ON/OFF of the N type FET Q902 to control the voltage of the contact 807 (memory cell). Accordingly, in the low-speed operation mode, the amount of current of each of the N type FETs Q902 and Q906 is adjusted according to the amount of current that flows through the reference cell 804.

In the sense amplifier circuit 900 according to the reference example, the first feedback control circuit NOR901 which is not used to control the voltage applied to the memory cell 802 is not operated in the low-speed operation mode. Accordingly, there is no through current of the first feedback control circuit NOR901 in the low-speed operation mode, and power consumption of the sense amplifier circuit 900 is reduced.

One problem caused in the sense amplifier circuit 900 according to the reference example is that, when the negative noise occurs (noise that is changed to a potential on the negative side) in a power supply VCC and a ground GND, this causes erroneous reading. Specifically, in the sense circuit 901, the potential of the ground GND of a microcomputer that is installed is changed to the negative side –V in the low-speed operation mode, and the potential of the contact (data line) 807 becomes lower than "gate voltage of the N type FET–threshold". This results in that, despite the reading of the memory cell that is turned off at a writing state (hereinafter referred to as an OFF cell), a current flows from the sense circuit 901 to the data line 807, and the same state as that is turned on at a delete state (hereinafter referred to as an ON cell) is read out, whereby erroneous data is output to the output terminal 914.

This erroneous reading will be further described with reference to FIGS. 19 and 20.

Figure 19:
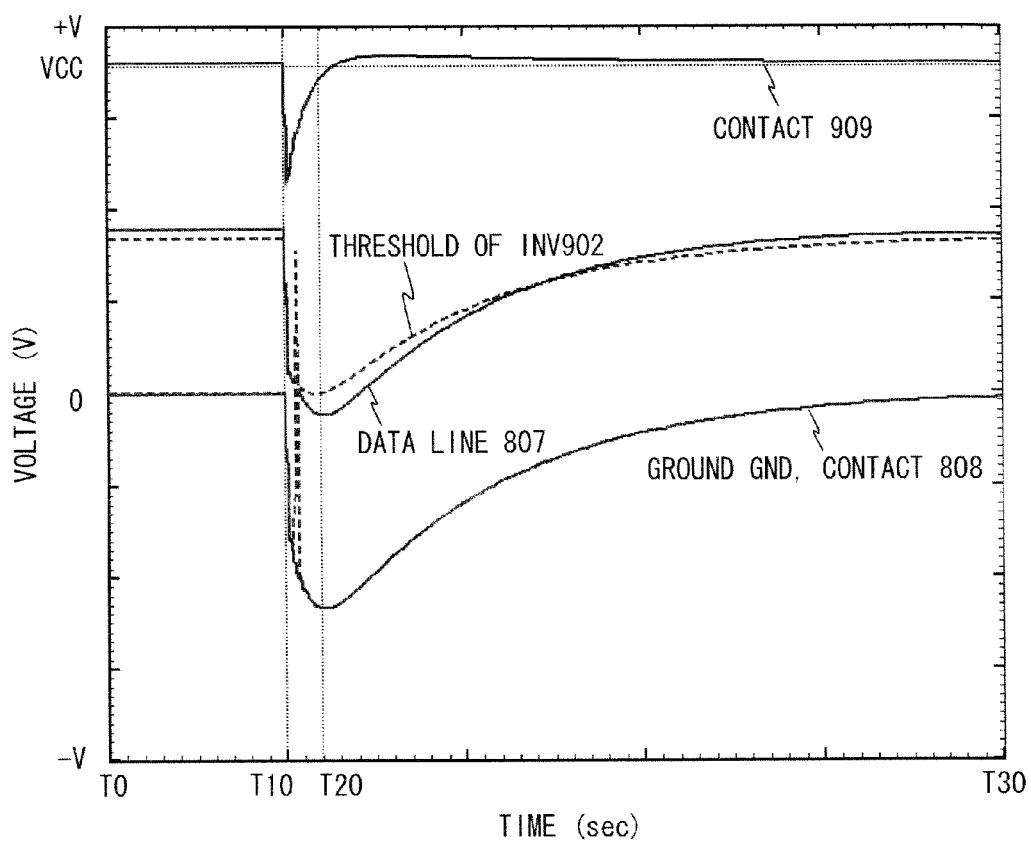
FIG. 19 is a waveform diagram showing an operation of the sense amplifier circuit according to the reference example.
Figure 20:
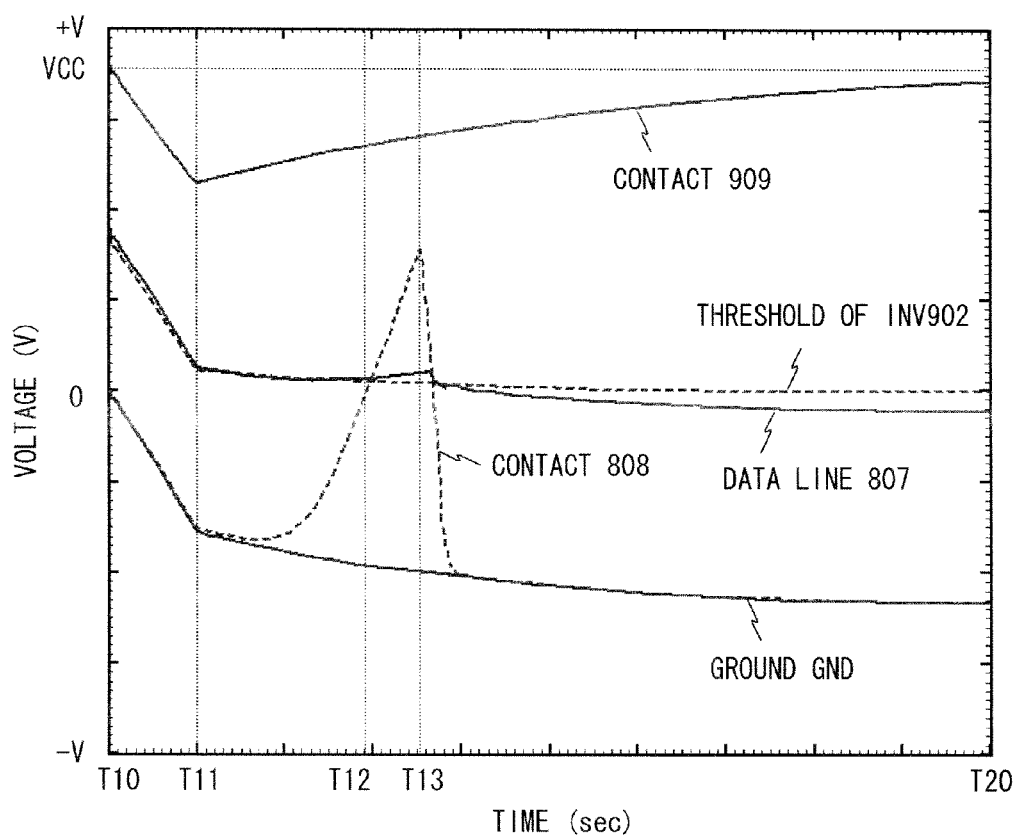
FIG. 20 is a waveform diagram showing an operation of the sense amplifier circuit according to the reference example.

FIG. 19 shows operational waveforms of the sense amplifier circuit 900 according to the reference example when negative noise occurs, and FIG. 20 shows operational waveforms in which T10 to T20 in FIG. 19 are enlarged.

First, in the low-speed operation mode, the gate of the N type FET Q902 of the sense circuit 901 has a potential of the power supply VCC, and a path of the contact 909 to the ground GND is set to a high impedance state.

At time T0 shown in FIG. 19, the potential of the ground GND and the potential of the contact 808 are 0 V, the potential of the data line 807 and a threshold of the inverter INV902 that receives a signal from the contact 808 are the intermediate potential of 0 V and the power supply VCC, and the potential of the contact 909 is equal to the potential of the power supply VCC. For example, the potential of the contact 909 is 3.6 V, the potential of the data line 807 is 1.8 V, and the threshold of the contact 808 is 1.7 V.

At time T10, upon occurrence of negative noise in the ground GND in the microcomputer that is installed, the potential of the contact 808, the potential of the data line 807, the threshold of the inverter INV902, and the potential of the contact 909 start to vary to the negative side −V while following the potential of the ground GND.

FIG. 20 shows the detail of an operation in which the potential of each contact in FIG. 19 is changed to the negative side −V while following the potential of the ground GND. As shown in FIG. 20, at time T11, only the contact 909 of the sense circuit 901 starts to return to the positive side +V. Then, since the potential difference between the data line 807 and the contact 909 becomes larger, Vgs, which is the potential difference between the gate and the source of the N type FET Q902 increases, and the current of the N type FET Q902 increases. This increased current also flows through the P type FET Q901 connected in series with the N type FET Q902. Further, this increased current also flows through the P type FET Q903 forming a current mirror with the P type FET Q901, which causes an increase in the potential of the contact 808. For example, when the potential of the ground GND is changed from 0 V to −1.5 V, the potential of the contact 909 is changed from 3.6 V to 2.3 V, and the potential of the data line 807 and the threshold of the inverter INV902 is changed from 1.8 V to 0.2 V. Then, the potential of the contact 808 is changed from 0 V to −1.5 V.

At time T12 shown in FIG. 20, the potential of the contact 808 exceeds the threshold of the inverter INV902. Since the mode is the low-speed operation mode in which the gate of the N type FET Q902 has the potential of the power supply VCC, the path of the contact 909 to the ground GND is in a high impedance state. Accordingly, when the potential of the contact 808 exceeds the threshold of the inverter INV902, the ON cell is erroneously read out when the OFF cell should be readout. For example, the potential of the ground GND is changed from −1.5 V to −1.8 V, the potential of the contact 909 is decreased to 2.3 V once from 3.6 V and then increases to 2.5 V, and the potential of the data line 807 is changed from 1.8 V to 0 V. The threshold of the inverter INV902 is changed from 1.8 V to 0 V, and the potential of the contact 808 is changed from −1.6 V to 0 V. Then, the potential of the contact 808 becomes the same potential as that of the threshold of the inverter INV902.

At time T13 shown in FIG. 20, the potential of the contact 808 is in the peak. The potential of the contact 808 exceeds the threshold of the inverter INV902, which results in that the ON cell is erroneously read out when the OFF cell should be read out. For example, when the potential of the ground GND is changed from −1.6 V to −2.0 V and the potential of the contact 909 is changed from 2.5 V to 2.7 V, the potential of the data line 807 and the threshold of the inverter INV902 are close to 0 V. However, the potential of the contact 808 is changed from 0 V to 1.7 V, which exceeds the threshold of the inverter INV 902 which receives the signal from the contact 808.

Then, as shown in FIG. 19, from time T20 to time T30, the potential of the contact 808, the potential of the data line 807, the threshold of the inverter INV902, and the potential of the contact 909 also start to return to the state shown at time T10 while following the potential of the ground GND. For example, the potential of the ground GND and the potential of the contact 808 are changed from −2.3 V to 0 V, the potential of the contact 909 is changed from 3.4 V to 3.6 V, the potential of the data line 807 and the potential of the threshold of the inverter INV902 return from 0 V to 1.7 V. Then, each of the potential of the ground GND, the potential of the contact 808, the potential of the data line 807, the threshold of the inverter INV902, and the potential of the contact 909 are the same potential as shown at time T0.

As described above, in the sense amplifier circuit 900 according to the reference example, when the ground GND is changed to the negative side −V in the low-speed operation mode, the potential of the contact 808 may exceed the threshold of the inverter INV902, which raises the problem that the ON cell is erroneously read out when the OFF cell should be read out.

First Embodiment

Figure 1:
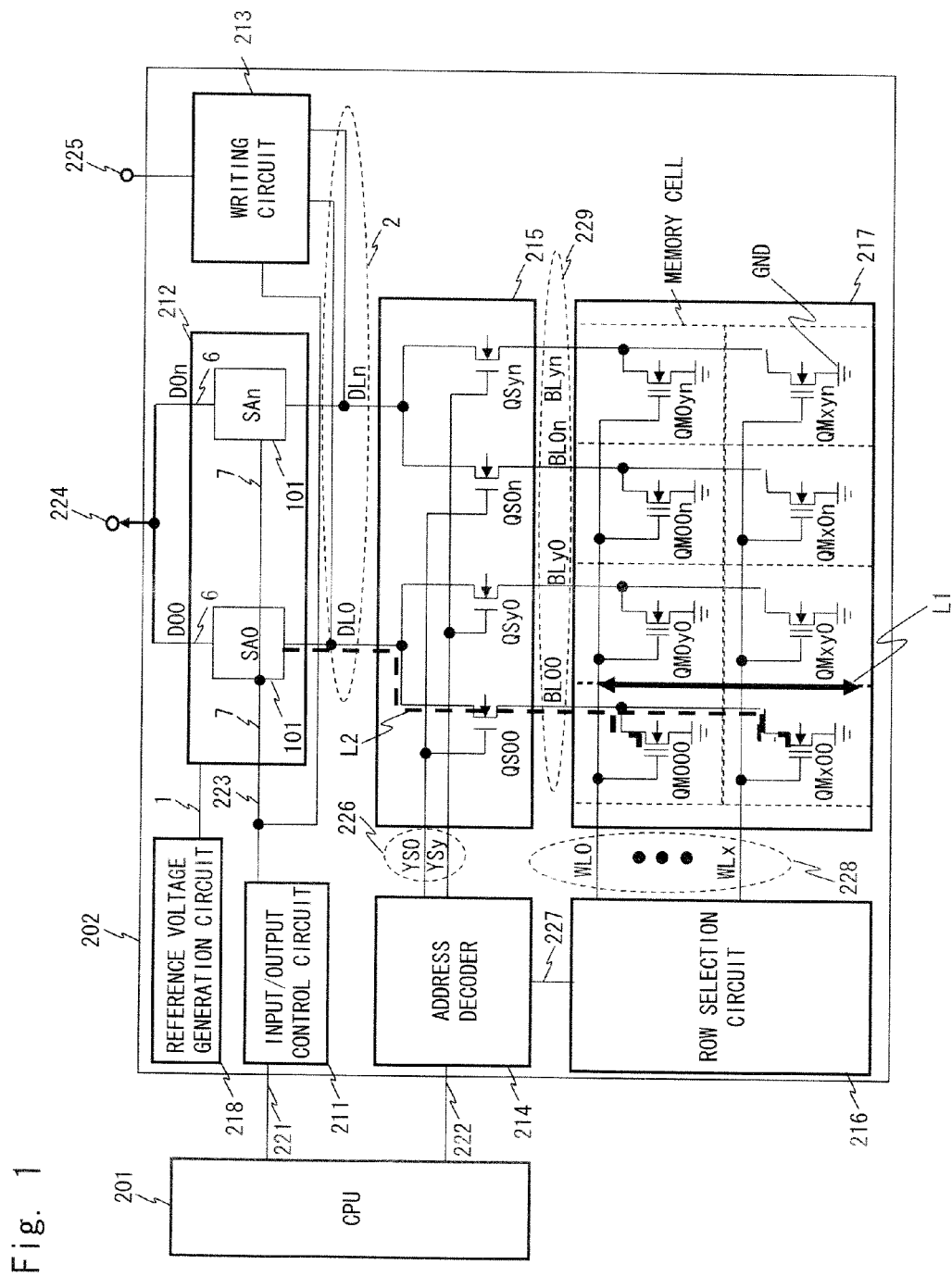
FIG. 1 is a configuration diagram showing a system configuration of a flash memory according to a first embodiment.

Hereinafter, with reference to the drawings, a first embodiment will be described. FIG. 1 shows a system configuration of a flash memory according to this embodiment. A flash memory 202 is a semiconductor memory device that performs data reading/writing from/to a memory cell of an address specified by a CPU 201. The CPU 201 and the flash memory 202 may be formed as a one-chip semiconductor device, or may be formed on different chips as a one-packaged semiconductor device.

As shown in FIG. 1, the flash memory 202 according to this embodiment includes an input/output control circuit 211, a reading circuit 212, a writing circuit 213, an address decoder 214, a column selection circuit 215, a row selection circuit 216, a memory cell array 217, and a reference voltage generation circuit 218.

In the memory cell array 217, a plurality of word lines 228 (WL to WLx) corresponding to a row address (X address) from 0 to x extend in a row direction, and a plurality of bit lines 229 (BL00 to BLyn) corresponding to a bit number n and a column address (Y address) from 0 to y extend in a column direction. In the memory cell array 217, a plurality of memory cells QM (QM000 to QMxyn) are arrayed in a matrix at intersections of the plurality of word lines 228 with the plurality of bit lines 229. In recent years, as a capacity of a semiconductor memory device becomes larger, the number of memory cells forming the memory cell array has been increasing, which makes the length of a bit line (distance L1 shown in FIG. 1) longer and increases parasitic capacities parasitic in the bit lines 229. Accordingly, the increase in the parasitic capacity of the bit line 229 increases the difference between a parasitic capacity from a sense amplifier circuit to a memory cell and a parasitic capacity in a sense amplifier, which leads to higher probability that erroneous reading as shown in FIG. 20 is carried out.

The reference voltage generation circuit 218 generates a reference voltage VREF, and outputs the reference voltage VREF to a reference voltage input terminal 1 of a reading circuit 212.

The CPU 201 outputs an external control signal 221 to control operations of the reading circuit 212 and a writing circuit 213, outputs written data to a data input terminal 225, and outputs to the flash memory 202 an address signal 222 that specifies an address of a memory cell in which reading/writing is performed.

The input/output control circuit 211 receives the external control signal 221 from the CPU 201, and outputs the external control signal 221 to the reading circuit 212 and the writing circuit 213 as an internal control signal 223.

The address decoder 214 receives the address signal 222 from the CPU 201, decodes the address signal 222 into a column address and a row address, and outputs a column address decode signal 226 (YS0 to YSy) and a row address decode signal 227.

The row selection circuit 216 is connected to the memory cells of the memory cell array 217 through the plurality of word lines 228 (WL to WLx) by rows. Upon receiving the row address decode signal 227, the row selection circuit 216 selects the word line 228 corresponding to the row address decode signal 227, and drives the memory cell by rows.

The column selection circuit 215 is connected to the memory cells of the memory cell array 217 through the plurality of bit lines 229 (BL00 to BLyn) by columns, and is connected to the writing circuit 213 and a plurality of sense amplifier circuits 101 (SA0 to SAn) of the reading circuit 212 through a plurality of data lines 2 (DL0 to DLn). Upon receiving the column address decode signal 226, the column selection circuit 215 selects the bit line 229 that corresponds to the column address decode signal 226. The column selection circuit 215 includes a plurality of N type FETs QS (QS00 to QSyn) corresponding to the plurality of bit lines 229. The N type FET QS is turned on according to the column address decode signal 226 to select the bit line 229, and connects the n-bit bit line 229 and the data line 2.

Data is read out from the memory cell QM selected by the row selection circuit 216 and the column selection circuit 215 by the reading circuit 212 or data is written into the memory cell QM selected by the row selection circuit 216 and the column selection circuit 215 by the writing circuit 213.

An operation mode of the reading circuit 212 is controlled by the internal control signal 223. Then the reading circuit 212 reads out the data in the memory cell QM connected via the data line 2, and outputs the data that is readout to a data output terminal 224 through data output lines DO0 to DOn. The reading circuit 212 includes the plurality of sense amplifier circuits 101 (SA0 to SAn) corresponding to the plurality of data lines 2 (DL0 to DLn). As will be described later, the sense amplifier circuit 101 includes a standby control terminal 7 that receives the internal control signal 223 as a standby control signal VSTB, receives the reference voltage VREF, and detects a current of the memory cell QM, thereby reading out the data stored in the memory cell QM.

An operation mode of the writing circuit 213 is controlled by the internal control signal 223. Then the writing circuit 213 receives written data from the data input terminal 225, and applies a writing voltage to the memory cell QM connected via the data line 2, thereby writing the data into the memory cell QM.

Figure 2:
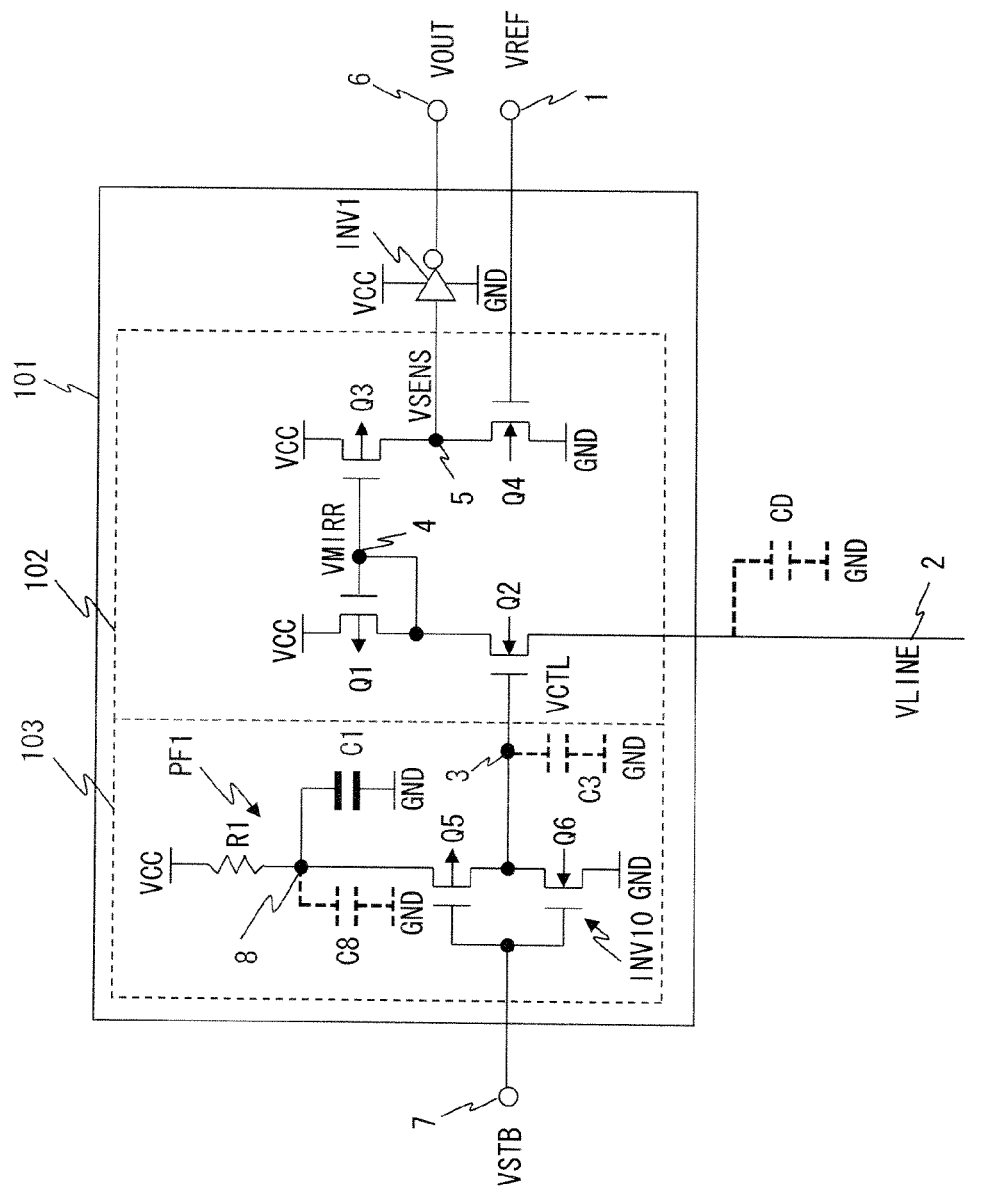
FIG. 2 is a circuit diagram showing a circuit configuration of a sense amplifier circuit according to the first embodiment.

FIG. 2 shows a configuration of the sense amplifier circuit 101 according to this embodiment. The sense amplifier circuit 101 switches the operation mode based on the standby control signal VSTB, and outputs an output signal VOUT which is the data read out from the memory cell GM based on the reference voltage VREF and a storage state in the memory cell GM connected to the data line 2.

As shown in FIG. 2, the sense amplifier circuit 101 includes a sense circuit 102, an inverter INV1, and a control circuit 103.

The sense circuit 102 senses (detects) a current of the memory cell GM connected to the data line 2, to output a sense signal VSENS based on the current of the memory cell GM and the reference voltage VREF.

The inverter INV1 (output inverter) compares a level of the sense signal VSENS sensed by the sense circuit 102 with a threshold VTH, to output the output signal VOUT as data read out from the memory cell GM.

The control circuit 103 outputs a sense control signal VCTL that controls an operation mode of the sense circuit 102. Further, according to this embodiment, filtering of the sense control signal VCTL is also performed.

The sense circuit 102 includes a P type FET Q1 and an N type FET Q2 connected in series between a power supply VCC and the data line 2 (data line signal VLINE), and a P type FET Q3 and an N type FET Q4 connected in series between a power supply VCC and a ground GND. Further, the P type FET Q1 and the P type FET Q3 form a current-mirror circuit that is connected in current mirror configuration via a contact 4 (mirror signal VMIRR). The P type FET Q1 is an input-side transistor of the current-mirror circuit, and the P type FET Q3 is an output-side transistor of the current-mirror circuit.

The N type FET Q2 is a sensing transistor that is connected to the data line 2 and senses a current that flows through the memory cell GM via the data line 2. As shown in FIG. 1, the memory cell GM and the sense amplifier circuit 101 are connected via the data line 2 and the bit line 229. The line that connects the memory cell GM and the sense amplifier circuit 101 including the data line 2 and the bit line 229 is called a memory cell connection line. For example, L2 in FIG. 1 is a memory connection line. Specifically, the N type FET Q2 is connected through the memory cell connection line that extends from the sense amplifier circuit to the memory cell. Further, since the memory cell is connected to a ground GND, the N type FET Q2 is connected to the ground GND through the memory cell connection line (data line and bit line). Further, an operation mode of the N type FET Q2 is controlled according to the sense control signal VCTL supplied from the control circuit 103.

The P type FET Q1 and the P type FET Q3 mirror a current that flows through the N type FET Q2 to output the current to a contact 5 (output terminal of the sense circuit 102). The N type FET Q4 is supplied with the reference voltage VREF as a control signal, and controls a potential of the contact 5 (sense signal VSENS) according to the reference voltage VREF.

Specifically, the P type FET Q1 has a gate and a drain connected to the contact 4, and a source connected to a power supply VCC. The N type FET Q2 has a gate (control terminal of the N type FET Q2) connected to a contact 3, a drain connected to the drain (contact 4) of the P type FET Q1, and a source connected to the data line 2.

The P type FET Q3 has a gate connected to the contact 4, a drain connected to the contact 5, and a source connected to a power supply VCC. The N type FET Q4 has a gate (control terminal of the N type FET Q4) connected to the reference voltage input terminal 1 that receives the reference voltage VREF, a drain connected to the contact 5, and a source connected to a ground GND.

The inverter INV1 has an input connected to the contact 5 and an output connected to an output terminal 6. The inverter INV1 is a CMOS inverter, and includes a P type FET and an N type FET (not shown) connected in series between a power supply VCC and a ground GND.

The control circuit 103 includes an inverter INV10 (buffer) and a filter PF1.

The inverter INV10 receives a standby control signal VSTB, and outputs the sense control signal VCTL obtained by inverting the standby control signal VSTB to the contact 3 (gate of the N type FET Q2). The inverter INV10 includes a P type FET Q5 and an N type FET Q6 connected in series between a power supply VCC and a ground GND. It can also be said that the inverter INV10 is an input control inverter that controls the N type FET Q2, and the P type FET Q5 and the N type FET Q6 are input control transistors.

The filter PF1 is a high pass filter that filters noise of the sense control signal VCTL of the contact 3, and has frequency characteristics based on the parasitic capacity of the data line 2 as described below. The filter PF1 includes a resistance element R1 and a capacitance element C1 that are connected in series between the power supply VCC and a ground GND. In this embodiment, a contact 8 between the resistance element R1 and the capacitance element C1 is connected to the P type FET Q5. When the P type FET Q5 is turned on, the contact 3 and the contact 8 are connected. Accordingly, even in the case shown in FIG. 2, the resistance element R1 is connected between the contact 3 and the power supply VCC, and the capacitance element C1 is connected between the contact 3 and a ground GND.

Specifically, the P type FET Q5 has a gate connected to the standby control terminal 7 that receives the standby control signal VSTB and the gate of the N type FET Q6, a drain connected to the contact 3 and the drain of the N type FET Q6, and a source connected to the contact 8. The N type FET Q6 has a gate connected to the standby control terminal 7, a drain connected to the contact 3, and a source connected to the ground GND.

The capacitance element C1 is an element to transmit potential variation of the data line 2 due to noise from the ground GND to the gate of the N type FET Q2 in the similar way, and is connected between the contact 8 and the ground GND. The resistance element R1 is an element to cut off high-frequency components of the power supply VCC, and is connected between the power supply VCC and the contact 8.

The method of setting the resistance element R1 and the capacitance element C1 of the filter PF1 will be described. In this embodiment, in order to transmit potential variation of the data line 2 due to noise from the ground GND by the capacitance element C1 in the similar way, the capacitance element C1 is set to the same capacity as a parasitic capacity CD of the data line 2. Specifically, a first capacity from the N type FET Q2 to the ground GND through the capacitance element C1 is made equal to a second capacity from the N type FET Q2 to the ground GND through a data line and a bit line.

First, a parasitic capacity C3 of the contact 3 will be calculated. The parasitic capacity C3 is a total amount of parasitic capacities as expressed by the following expression 1.

Parasitic capacity $C3$=gate capacity of the $N$ type FET $Q2$+wiring capacity of the contact $3$+$N$ type FET $Q6$ drain-side junction capacity (expression 1)

Next, a parasitic capacity C8 of the contact 8 will be calculated. The parasitic capacity C8 is only a wiring capacity of the contact 8. The parasitic capacity C3 and the parasitic capacity C8 vary the potential of the contact 3 according to noise from the ground GND. Accordingly, it is sufficient that the following expression 2 is established in order to make potential variation by the noise from the ground GND equal between the data line 2 and the contact 8.

$CD=C1+C3+C8$ (expression 2)

From the expression 2, a set value of the capacitance element C1 is calculated from the following expression 3.

$C1=CD-C3-C8$ (expression 3)

The parasitic capacity CD of the data line 2 is a total amount of parasitic capacities as expressed by the following expression 4. The memory cells of the memory cell array are represented by QM0 and QMx in the expression 4. However, since there exist a plurality of memory cells of QM0 to QMx, the parasitic capacity CD is such a value in which the capacities of the memory cells are added.

$CD$=source-side junction capacity of the $N$ type FET $Q2$+wiring capacity of the data line 2 (e.g., DL0 in FIG. 1)+drain-side junction capacity of the $N$ type FET $QS$ (e.g., $QS$00 in FIG. 1)+source-side junction capacity of the $N$ type FET $QS$ (e.g., $QS$00 in FIG. 1)+wiring capacity of the bit line BL (e.g., BL00 in FIG. 1)+drain-side junction capacity of the memory cell $QM$0 (e.g.,$QM$000 in FIG. 1)+drain-side junction capacity of the memory cell $QMx$ (e.g., $QMx$00 in FIG. 1) (expression 4)

Further, the resistance element R1 is set be a high pass filter in accordance with frequency characteristics of the capacitance element C1 and the noise from the ground GND. A cutoff frequency of the high pass filter is made equal to a frequency f of the noise from the ground GND, and a set value of the resistance element R1 is calculated by the following expression 5.

$R1=1/\{2\pi \cdot f \cdot (C1+C3+C8)\}$ (expression 5)

For example, the capacitance element C1 is formed as shown in FIGS. 3A, 3B, 4A and 4B.

In FIGS. 3A and 3B, the capacitance element C1 is formed of a MOS transistor structure, and is formed as a capacitance element using a gate capacity. FIG. 3A is an example in which the capacitance element C1 is formed by an N well capacitor. As shown in FIG. 3A, an N type well region 302N is formed on a main surface side of a P type semiconductor substrate 301 connected to a ground GND. Two N+ type active regions 303 each having a length L corresponding to a source region and a drain region are arranged in parallel on a substrate surface in the N type well region 302N. A polysilicon film 305 having a width W corresponding to a gate electrode is formed on the N type well region 302N corresponding to a channel region between the N+ type active regions 303 with an SiO2 film 304 having a film thickness of d corresponding to a gate insulating film interposed therebetween. A contact 8 is connected to the polysilicon film 305 and the N+ type active regions 303 are connected to a ground GND, thereby forming the capacitance element C1 shown in FIG. 2.

The capacity of the N well capacitor as shown in FIG. 3A is expressed by the following expression 6.

$C=\in \cdot \in r \cdot S/d$ (expression 6)

In the expression 6, $\in$ represents a dielectric constant, $\in r$ represents a relative dielectric constant of SiO2, S represents an area (S=W·L), and d represents a film thickness of SiO2.

FIG. 3B is an example in which the capacitance element C1 is formed of a MOS capacitor. As shown in FIG. 3B, a P type well region 302P is formed on a main surface side of a P type semiconductor substrate 301 connected to a ground GND. Two N+ type active regions 303 each having a length L and corresponding to a source region and a drain region are formed in parallel on a substrate surface in the P type well region 302P. A polysilicon film 305 having a width W corresponding to a gate electrode is formed on the P type well region 302P corresponding to a channel region between the N+ type active regions 303 with an SiO2 film 304 having a film thickness d corresponding to a gate insulating film interposed therebetween. A contact 8 is connected to the polysilicon film 305, the N+ type active regions 303 are connected to a ground GND, thereby forming the capacitance element C1 shown in FIG. 2. The capacity of the MOS capacitor shown in FIG. 3B is expressed by the expression 6 as is similar to FIG. 3A.

FIG. 4A is an example of forming the capacitance element C1 by a parallel flat plate metal capacitor. As shown in FIG. 4A, among a plurality of wiring layers that are laminated in the semiconductor device, a line 311 is formed to have a length L and a width W on an identical wiring layer with a line 312. The line 312 is formed in parallel with the line 311 with an interval d therebetween. An SiO2 film 313 which is an interlayer insulation film is formed between the line 311 and the line 312. A contact 8 is connected to the line 311, and the line 312 is connected to a ground GND, thereby forming the capacitance element C1 shown in FIG. 2. The capacity of the parallel flat plate metal capacitor shown in FIG. 4A is expressed by the expression 6, as is similar to FIG. 3A.

FIG. 4B is an example of forming the capacitance element C1 by a metal capacitor between upper and lower layers. As shown in FIG. 4B, among a plurality of wiring layers that are laminated in the semiconductor device, a line (lower line) 311 in a lower wiring layer is formed to have a length L and a width W. A line (upper layer) 312 is formed in parallel with the line 311 on an upper wiring layer which is just above the lower wiring layer with an interval d therebetween. An SiO2 film 313, which is an interlayer insulation film, is formed between the line 311 and the line 312. The line 311 is connected to a contact 8, and the line 312 is connected to a ground GND, thereby forming the capacitance element C1 shown in FIG. 2. The capacity of the metal capacitor between upper and lower layers shown in FIG. 4B is expressed by the expression 6, as is similar to FIG. 3A.

Figure 5:
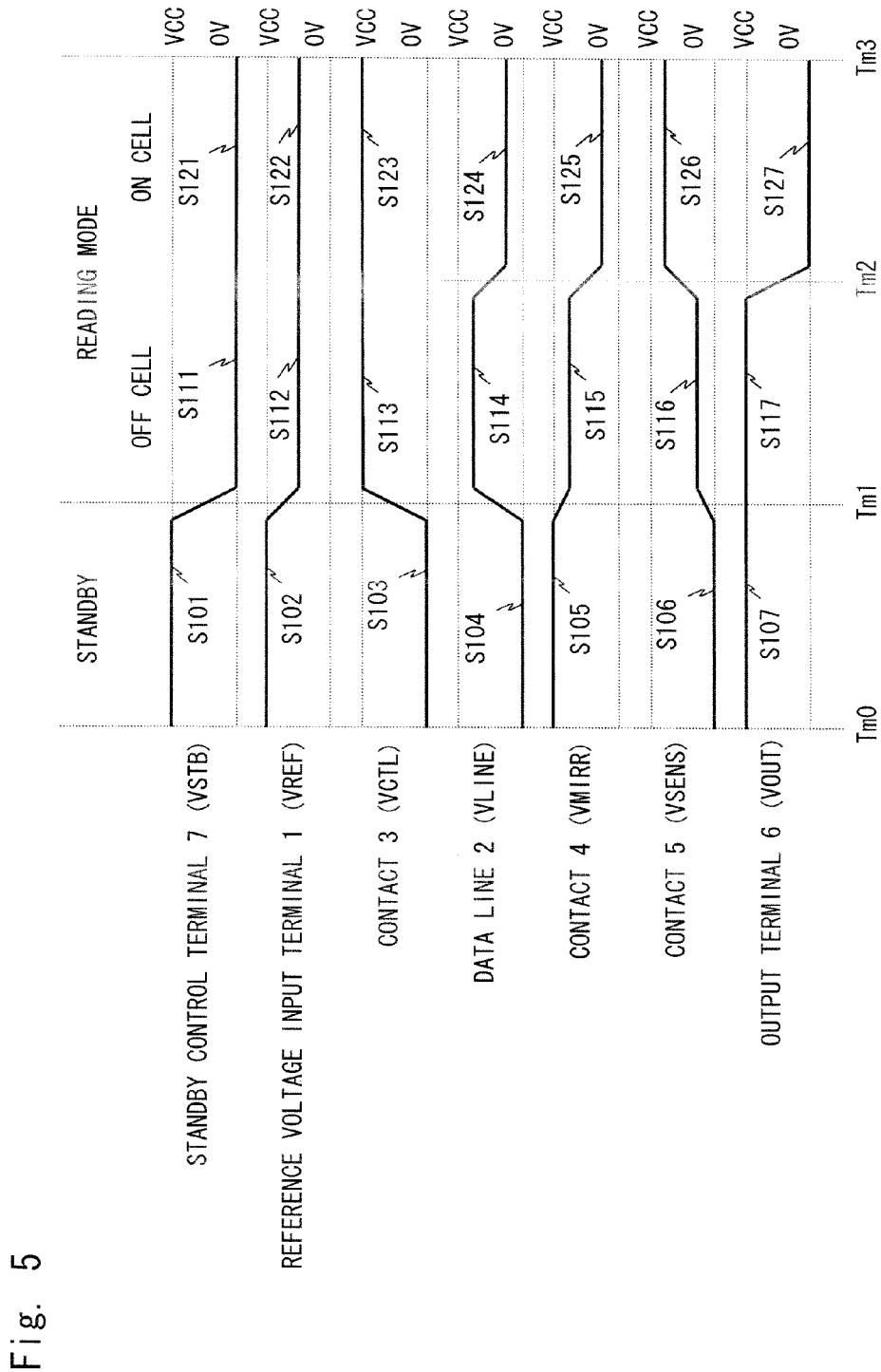
FIG. 5 is a timing chart showing an operation of the sense amplifier circuit according to the first embodiment.

FIG. 5 is a timing chart showing an operation of the sense amplifier circuit 101 according to this embodiment. Time Tm0 to Tm1 show each signal in a standby state, time Tm1 to Tm2 show each signal when the OFF cell is read out in a reading mode state, and time Tm2 to Tm3 show each signal when the ON cell is read out in the reading mode state.

First, since the mode is the standby state at time Tm0, a high-level signal is input as the standby control signal VSTB and the reference voltage VREF. Thus, the potential of the standby control terminal 7 and the potential of the reference voltage input terminal 1 are equal to the potential of the power supply VCC (S101, S102).

Since the standby control signal VSTB is inverted by the inverter INV10 to be the sense control signal VCTL, the potential of the contact 3 of the sense amplifier circuit 101 becomes 0 V, which is the inversion of the power supply VCC (S103).

Since the sense control signal VCTL supplied to the gate of the N type FET Q2 of the sense amplifier circuit 101 is 0 V, the N type FET Q2 is turned off and the data line 2 is separated from the power supply VCC. Thus, the potential of the data line 2 (VLINE) becomes 0 V (S104).

Further, since the voltage of the gate of the N type FET Q2 is 0 V, there is no current path from the power supply VCC to the data line 2. Then the potential of the contact 4 (VMIRR) of the sense amplifier circuit 101 becomes the potential of the power supply VCC (S105).

Then, the gate of the P type FET Q3 has the potential of the power supply VCC by the mirror signal VMIRR, the P type FET Q3 is turned off. Further, since the gate of the N type FET Q4 has the potential of the power supply VCC by the reference voltage VREF, the N type FET Q4 is turned off. Accordingly, the potential of the contact 5 (VSENS) of the sense amplifier circuit 101 is 0 V (S106).

Further, since the sense signal VSENS is inverted by the inverter INV1 to be the output signal VOUT, the potential of the output terminal 6 is equal to the potential of the power supply VCC after the inversion of 0 V (S107). In this way, the reading circuit 212 (sense amplifier circuit 101) is in the standby state.

Next, since the state is the reading mode state at time Tm1, a low level signal is input as the standby control signal VSTB, and an intermediate level signal is input as the reference voltage VREF. Specifically, the potential of the standby control terminal 7 changes from the potential of the power supply VCC to 0 V, and the potential of the reference voltage input terminal 1 changes from the potential of the power supply VCC to the intermediate potential between 0 V and the power supply VCC (S111, S112).

Since the standby control signal VSTB is inverted by the inverter INV10 to be the sense control signal VCTL, the potential of the contact 3 is the inversion of 0 V, and changes from 0 V to the potential of the power supply VCC (S113).

Since the sense control signal VCTL supplied to the gate of the N type FET Q2 of the sense amplifier circuit 101 changes from 0 V to the power supply VCC, the N type FET Q2 starts conduction and the data line 2 and the power supply VCC are connected, which allows reading of the memory cell QM. Since the OFF cell is selected and read out at time Tm1, the potential of the data line 2 (VLINE) is a potential which is equal to or greater than "potential of the power supply VCC−threshold of the N type FET Q2" (S114).

Further, since the gate of the N type FET Q2 has the potential of the power supply VCC, there is generated a current path from the power supply VCC to the data line 2. Then, the potential of the contact 4 (VMIRR) is a potential which is equal to or greater than "potential of the power supply VCC−threshold of the P type FET Q1" (S115).

Then, the P type FET Q3 starts conduction by the mirror signal VMIRR, and the N type FET Q4 also starts conduction by the reference voltage VREF. Accordingly, the state is the ratio state of the P type FET Q3 and the N type FET Q4. At this time, since the gate of the P type FET Q3 has a potential which is equal to or greater than "potential of the power supply VCC−threshold of the P type FET Q1", the potential of the contact 5 (VSENS) is a potential which is equal to or smaller than the threshold of the inverter INV1 between 0 V and the potential of the power supply VCC (S116).

Further, since the sense signal VSENS is inverted by the inverter INV1 to be the output signal VOUT, the potential of the output terminal 6 is equal to the potential of the power supply VCC which is obtained by inverting and amplifying a potential which is equal to or smaller than the threshold of the inverter INV1 (S117). In this way, the reading circuit 212 (sense amplifier circuit 101) is in the reading mode state of the OFF cell.

Next, since the state is the reading mode state at time Tm2, as is similar to S111 to S113, the potential of the standby control terminal 7 is 0 V, the potential of the reference voltage input terminal 1 is the intermediate potential, and the potential of the contact 3 is the power supply VCC (S121 to S123). Then, the N type FET Q2 connects the data line 2 and the power supply VCC, which allows reading of the memory cell QM.

At time Tm2, the ON cell is selected and read out. Thus, the potential of the data line 2 (VLINE) is a potential which is equal to or smaller than "potential of the power supply VCC−threshold of the N type FET Q2" (S124).

Further, since a current path from the power supply VCC to the data line 2 is generated by the N type FET Q2, the potential of the contact 4 (VMIRR) is a potential which is equal to or smaller than "potential of the power supply VCC−threshold of the P type FET Q1" (S125).

Then, the state is the ratio state of the P type FET Q3 and the N type FET Q4 and the gate of the P type FET Q3 has a potential which is equal to or smaller than "potential of the power supply VCC−threshold of the P type FET Q1". Thus, the potential of the contact 5 (VSENS) is a potential which is equal to or greater than the threshold of the inverter INV1 between 0 V and the potential of the power supply VCC (S126).

Further, the inverter INV1 renders the potential of the output terminal 6 (VOUT) be 0 V, which is obtained by inverting and amplifying the potential of the contact 5 (S127). In this way, the reading circuit 212 (sense amplifier circuit 101) is in the reading mode state of the ON cell.

Figure 6:
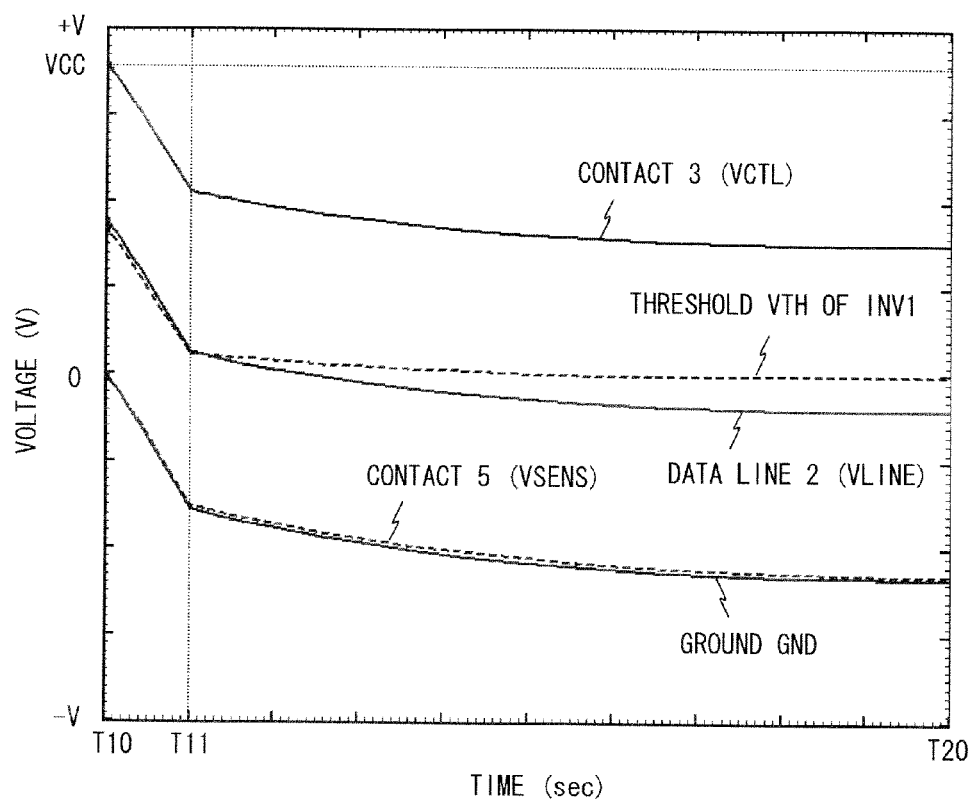
FIG. 6 is a waveform diagram showing an operation of the sense amplifier circuit according to the first embodiment.

FIG. 6 shows operational waveforms when the sense amplifier circuit 101 according to this embodiment receives negative noise. FIG. 6 shows each signal of T10 to T20 when the negative noise occurs, as is similar to FIG. 20.

First, assume a case in which the sense amplifier circuit 101 is in the reading mode state of the OFF cell. Then, at time T10, the potential of the ground GND and the potential of the contact 5 (VSENS) are 0 V, the potential of the data line 2 (VLINE) and the threshold of the inverter INV1 (VTH) are the intermediate potential between 0 V and the power supply VCC, and the potential of the contact 3 (VCTL) is the potential of the power supply VCC. For example, the potential of the contact 3 is 3.6 V, the potential of the data line 2 is 1.8 V, and the threshold of the inverter INV1 is 1.7 V.

Next, from time T10 to time T11, when negative noise occurs in the ground GND in a microcomputer (semiconductor device) in which the flash memory 202 is installed, the potential of the data line 2 (VLINE), the potential of the contact 3 (VCTL), the potential of the contact 5 (VSENS), and the threshold of the inverter INV1 (VTH) start potential variation to the negative side −V while following the potential of the ground GND.

Next, at time T11, the potential of the data line 2 (VLINE), the potential of the contact 3 (VCTL), the potential of the contact 5 (VSENS), and the threshold of the inverter INV1 (VTH) follow the potential of the ground GND. For example, when the potential of the ground GND is changed from 0 V to −1.6 V, the potential of the contact 3 is changed from 3.6 V to 2.1 V, the potential of the data line 2 is changed from 1.8 V to 0.2 V, the threshold of the inverter INV1 is changed from 1.7 V to 0.2 V, the potential of the contact 5 is changed from 0 V to −1.6 V, and the potential difference between the threshold of the inverter INV1 and the contact 5 is kept to 1.8 V.

In this embodiment, the capacitance element C1 is connected to the contact 8, and the capacitance element C1 is set so that the influence at the time of occurrence of the negative noise is equal between the data line 2 and the contact 3. Thus, the potential of the contact 5 never exceeds the threshold of the inverter INV1.

Accordingly, also at time T11 and after T11, the potential of the data line 2 (VLINE), the potential of the contact 3 (VCTL), the potential of the contact 5 (VSENS), and the threshold of the inverter INV1 (VTH) follow the potential of the ground GND, and continue to follow until time T20.

Further, at time T20, for example, when the potential of the ground GND is changed from −1.6 V to −2.4 V, the potential of the contact 3 is changed from 2.1 V to 1.6 V, the potential of the data line 2 is changed to −0.4 V, the threshold of the inverter INV1 is changed from 0.2 V to 0 V, the potential of the contact 5 is changed from −1.6 V to −2.4 V, and the potential difference between the threshold of the inverter INV1 and the contact 5 is kept to 2.4 V.

In this way, with the use of the sense amplifier circuit 101 according to this embodiment, even when the potential of the ground GND of the microcomputer that is installed is changed to the negative side −V in the reading mode, the potential of the data line 2 does not decrease below "gate voltage of the N type FET−threshold". Thus, there is no case in which erroneous data is output to the output terminal 6 when the OFF cell is read out.

The reason for it is that, since the capacitance element C1 is connected to the contact 8 and the capacity as stated above is set, as shown in FIG. 6, at time T11 and after time T11, the potential difference between the data line 2 and the contact 3 is constant, and Vgs, which is the potential difference between the gate and the source of the N type FET Q2 is also constant and there is no change in the current. There is no change in the current of the P type FET Q1 which is connected in series with the N type FET Q2, and there is no change in the current of the P type FET Q3 which forms a current mirror with the P type FET Q1. Accordingly, the potential of the contact 5 only follows the potential of the ground GND and does not exceed the threshold of the inverter INV1, which makes it possible to prevent a case in which the ON cell is erroneously read out when the OFF cell should be read out.

As stated above, according to this embodiment, the capacitance element C1 which transmits potential variation of the data line due to noise from the ground GND to the gate of the sensing transistor in the similar way and the resistance element R1 which improves power supply impedance of the buffer (INV10) are included.

In this way, when the potential of the data line is decreased by the noise from the ground GND, the potential of the source of the sensing transistor decreases. However, at the same time, the potential of the gate of the sensing transistor decreases by the capacitance element C1. Accordingly, Vgs, which is the potential difference between the gate and the source of the sensing transistor becomes constant and the current also becomes constant. Therefore, there is no change in current when the OFF cell is read out and it is possible to avoid such a situation in which the ON cell is erroneously read. Accordingly, it is possible to improve the reading accuracy of the sense amplifier circuit.

Second Embodiment

Hereinafter, with reference to the drawings, a second embodiment will be described. This embodiment is an example in which the position where the resistance element R1 and the capacitance element C1 are connected is changed compared to the sense amplifier circuit according to the first embodiment. Other configurations are similar to those in the first embodiment. Further, the configuration of this embodiment may be applied to another embodiment.

Figure 7:
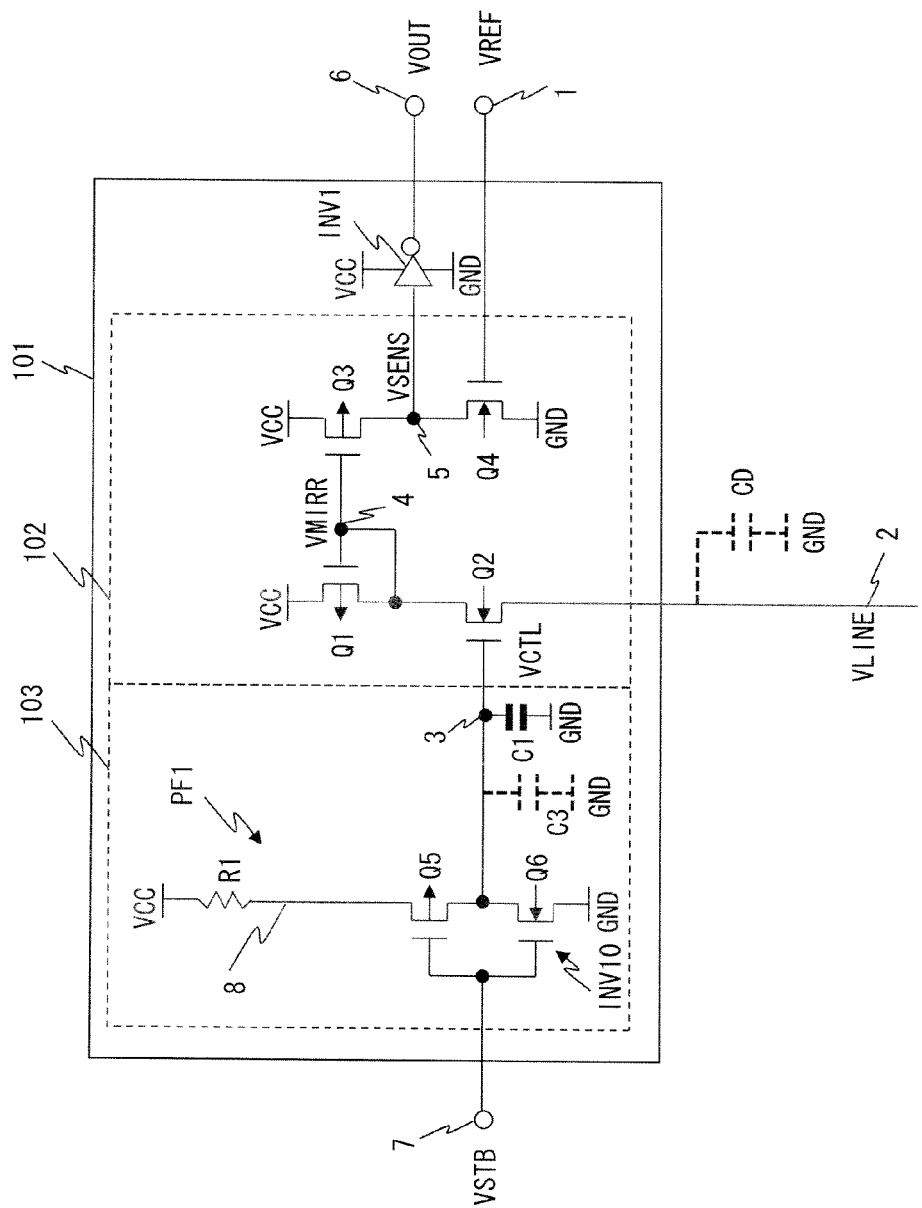
FIG. 7 is a circuit diagram showing a circuit configuration of a sense amplifier circuit according to a second embodiment.
Figure 8:
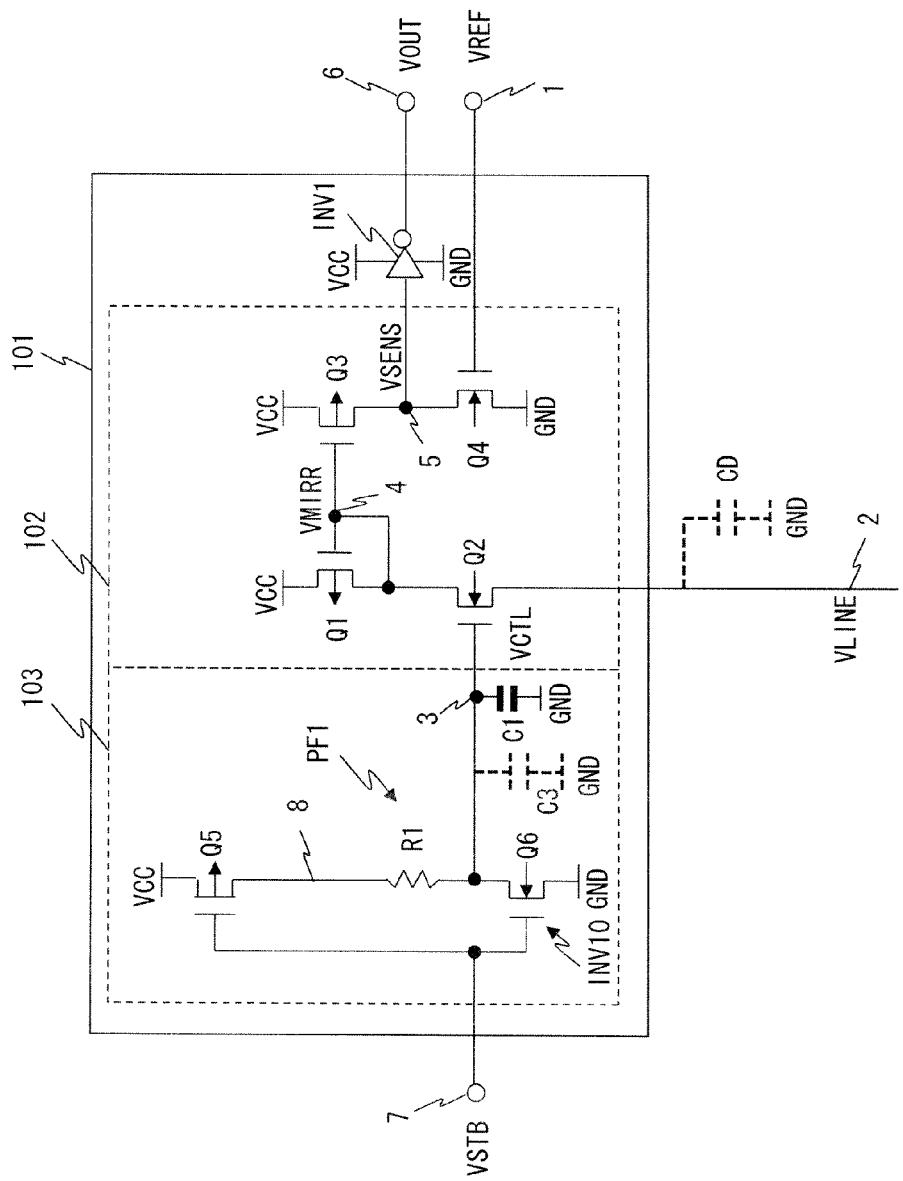
FIG. 8 is a circuit diagram showing a circuit configuration of the sense amplifier circuit according to the second embodiment.

FIGS. 7 and 8 each show a configuration of the sense amplifier circuit according to this embodiment. In the example shown in FIG. 7, the position where the capacitance element C1 is connected is changed compared to the sense amplifier circuit shown in FIG. 2. Specifically, in the sense amplifier circuit shown in FIG. 2, the capacitance element C1 has one end connected to the contact 8 and the other end connected to the ground GND. In this embodiment, as shown in FIG. 7, the capacitance element C1 has one end connected to the contact 3 and the other end connected to a ground GND. In this case, the resistance element R1 and the capacitance element C1are connected in series through the P type FET Q5 to form a filter PF1. Further, while the set values of the capacitance element C1 and the resistance element R1 have been calculated including the parasitic capacity C8 in the first embodiment (expression 3, expression 5), they may be calculated without including the parasitic capacity C8 in the example shown in FIG. 7.

Further, in the example shown in FIG. 8, the positions of the resistance element R1 and the capacitance element C1 are changed compared to the sense amplifier circuit shown in FIG. 2. Specifically, in the sense amplifier circuit shown in FIG. 2, the resistance element R1 has one end connected to the power supply VCC and the other end connected to the contact 8. The capacitance element C1 has one end connected to the contact 8 and the other end connected to the ground GND. In this embodiment, as shown in FIG. 8, the source of the P type FET Q5 is connected to a power supply VCC, and the resistance element R1 has one end connected to the drain of the P type FET Q5 and the other end connected to the contact 3 (drain of the N type FET Q6). Further, the capacitance element C1 has one end connected to the contact 3 and the other end connected to a ground GND. In this case, the resistance element R1 and the capacitance element C1 are connected in series through the contact 3 to form a filter PF1. Also in FIG. 8, there is no need to consider the parasitic capacity C8 for the set values of the capacitance element C1 and the resistance element R1, as is similar to FIG. 7.

In this way, even when the position of connection between the capacitance element C1 and the resistance element R1 according to the first embodiment is changed, it is possible to obtain the same effect as in the first embodiment. In summary, it is only required that the capacitance element is connected to a side of the ground GND with respect to the contact 3 and the resistance element R1 is connected to a side of the power supply VCC with respect to the contact 3. By setting the capacity of the capacitance element C1 based on the parasitic capacity CD, it is possible to prevent erroneous reading due to occurrence of noise.

Third Embodiment

Hereinafter, with reference to the drawings, a third embodiment will be described. This embodiment shows an example in which calculation of the set values of the capacitance element C1 and the resistance element R1 is changed compared to the sense amplifier circuit according to the first embodiment. Other configurations are similar to those in the first embodiment. Further, the set values of this embodiment may be applied to other embodiments.

Figure 9:
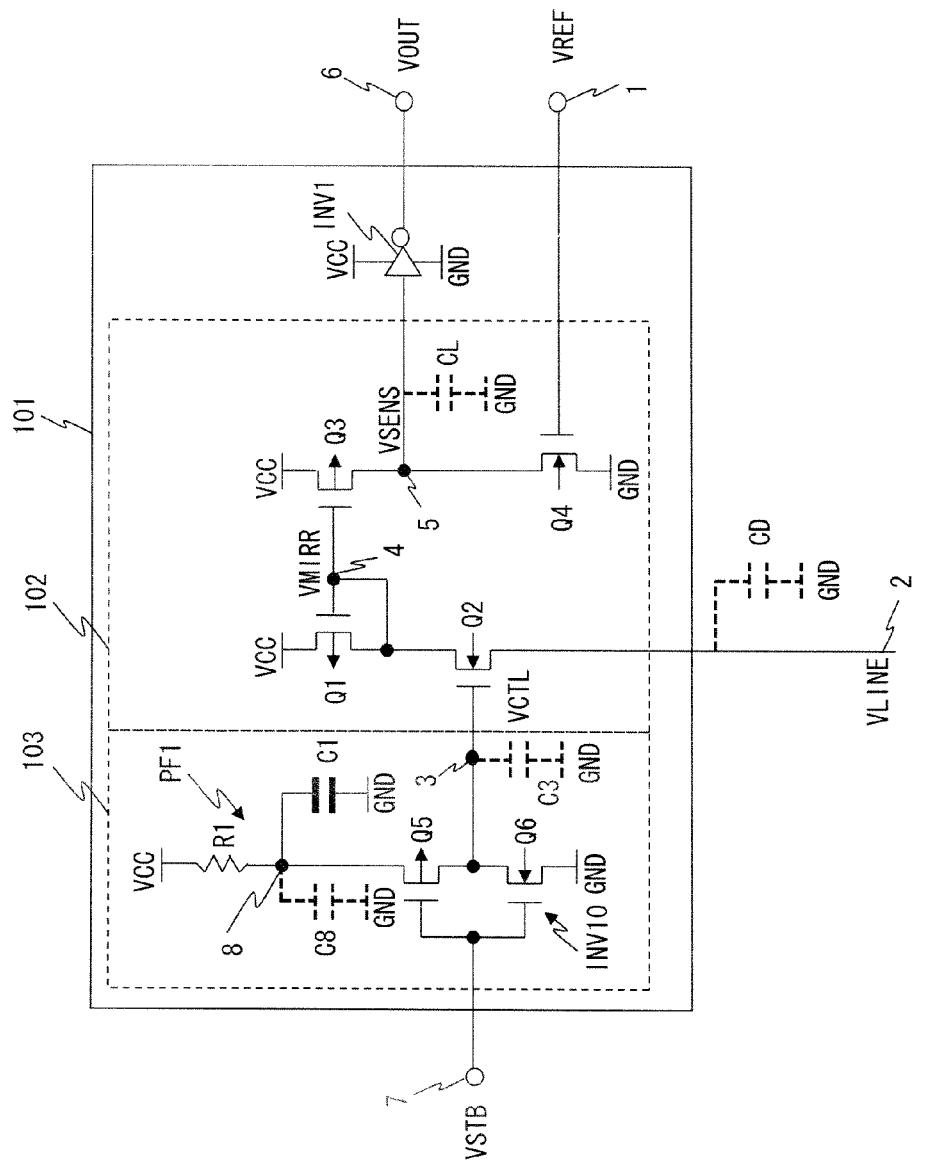
FIG. 9 is a circuit diagram showing a circuit configuration of a sense amplifier circuit according to a third embodiment.

FIG. 9 shows a configuration of a sense amplifier circuit according to this embodiment. A sense amplifier circuit 101 shown in FIG. 8 is formed of the same elements and with the same connection relation as those of FIG. 2 according to the first embodiment. Compared to the sense amplifier circuit 101 according to the first embodiment, a sense amplifier circuit 101 according to the third embodiment considers a parasitic capacity CL that is parasitic between the contact 5 and the ground GND. Specifically, the first capacity from the N type FET Q2 to the ground GND through the capacitance element C1 is the capacity based on the second capacity from the N type FET Q2 to the ground GND through the data line and the bit line and a third capacity that is parasitic in the output stage of the sense circuit 102. In this embodiment, the potential of the data line 2 that is varied due to the noise from the ground GND is set so as not to exceed the threshold of the inverter INV1, and a capacity that does not at least cause erroneous reading is set as the capacitance element C1. Specifically, the capacitance element C1 and the resistance element R1 are set as follows.

First, the parasitic capacity CL is calculated. The parasitic capacity CL is the total amount of parasitic capacities as expressed by the following expression 11.

Parasitic capacity $CL$=drain-side junction capacity of the $P$ type FET $Q3$+drain-side junction capacity of the $N$ type FET $Q4$+input capacity of the inverter INV1+wiring capacity of the contact 5 (expression 11)

The condition to prevent such a situation in which the ON cell is erroneously read out when the OFF cell should be read out is that the potential of the contact 5 does not exceed the threshold of the inverter INV1. When the potential in a stable state in which the contact 5 receives no noise is represented by V5 and the threshold of the inverter INV1 (VTH) is represented by VINV1, a potential variation amount ΔV5 allowed for the contact 5 is expressed by the following expression 12.

$\Delta V5 = VINV1 - V5$ (expression 12)

When a current increased amount that is allowed for the P type FET Q3 is represented by ΔIQ3, this current increased amount ΔIQ3 can be expressed by the following expression 13 from a noise generation period T from the ground GND and the parasitic capacity CL.

$\Delta IQ3 = \Delta V5 \cdot CL/T$ (expression 13)

When a current of the P type FET Q1 is represented by IQ1, a current of the P type FET Q3 is represented by IQ3, and a mirror ratio of the P type FET Q1 and the P type FET Q3 forming a current mirror is represented by M, this mirror ratio M is expressed by the following expression 14.

$M = IQ3/IQ1$ (expression 14)

When a current increased amount allowed for the P type FET Q1 is represented by ΔIQ1, this current increased amount ΔIQ1 is expressed by the following expression 15 from expression 14.

$\Delta IQ1 = \Delta IQ3/M$ (expression 15)

Since the P type FET Q1 and the N type FET Q2 are connected in series, when a current increased amount allowed for the N type FET Q2 is represented by ΔIQ2, the current increased amount ΔIQ2 is expressed by the following expression 16.

$\Delta IQ2 = \Delta IQ1$ (expression 16)

When the potential in the stable state in which the data line 2 receives no noise is represented by V2 and the potential in the stable state in which the contact 3 receives no noise is represented by V3, the current IQ2 of the N type FET Q2 satisfies the following expression 17 from the Shockley's equation. The symbol "^" represents a power.

$IQ2 = \frac{1}{2} \cdot \beta \cdot ((V3-V2)-Vt)^2$ (expression 17)

When a potential variation amount of the data line 2 due to the noise from the ground GND is represented by ΔV2 and a potential variation amount allowed for the contact 3 is represented by ΔV3, a current IQ2d allowed for the N type FET Q2 satisfies the following expression 18 from the Shockley's expression.

$IQ2d = \frac{1}{2} \cdot \beta \cdot (((V3+\Delta V3)-(V2+\Delta V2))-Vt)^2$ (expression 18)

The current increased amount ΔIQ2 allowed for the N type FET Q2 is expressed by the following expression 19.

$\Delta IQ2 = IQ2d - IQ2$ (expression 19)

Substituting the expression 17 and the expression 18 into the expression 19 gives ΔV3 as expressed by the following expression 20.

$\Delta V3 = -(V3-V2-Vt) + \sqrt{((V3-V2-Vt)^2 + 2 \cdot \Delta IQ2/\beta)} + \Delta V2$ (expression 20)

The relation between the capacity ratio of the capacitance element C1, the parasitic capacity C3 of the contact 3, and the parasitic capacity C8 of the contact 8 to the parasitic capacity CD of the data line 2, and the potential variation amount ratio of the potential variation amount ΔV3 of the contact 3 to the potential variation amount ΔV2 of the data line 2 is expressed by the following expression 21.

$(C1+C3+C8)/CD = \Delta V3/\Delta V2$ (expression 21)

Changing the form of the expression 21 to the expression of C1 gives the following expression 22.

$C1 = CD \cdot \Delta V3/\Delta V2 - C3 - C8$ (expression 22)

From the above expression, substituting the expression 20 into the expression 22 gives the capacitance element C1 as expressed by the following expression 23.

$$C1 = CD \cdot (-(V3-V2-Vt) + \sqrt{((V3-V2-Vt)^2 + 2 \cdot (((VINV1-V5) \cdot CL/T)/(IQ3/IQ1))/\beta) + \Delta V2}) / \Delta V2 - C3 - C8 \quad \text{expression (23)}$$

Further, the resistance element R1 can be obtained from the set value of the capacitance element C1 as shown by the following expression 24, as is similar to the first embodiment.

$$R1 = 1/\{2\pi \cdot f \cdot (C1+C3+C8)\} \quad \text{expression (24)}$$

Figure 10:
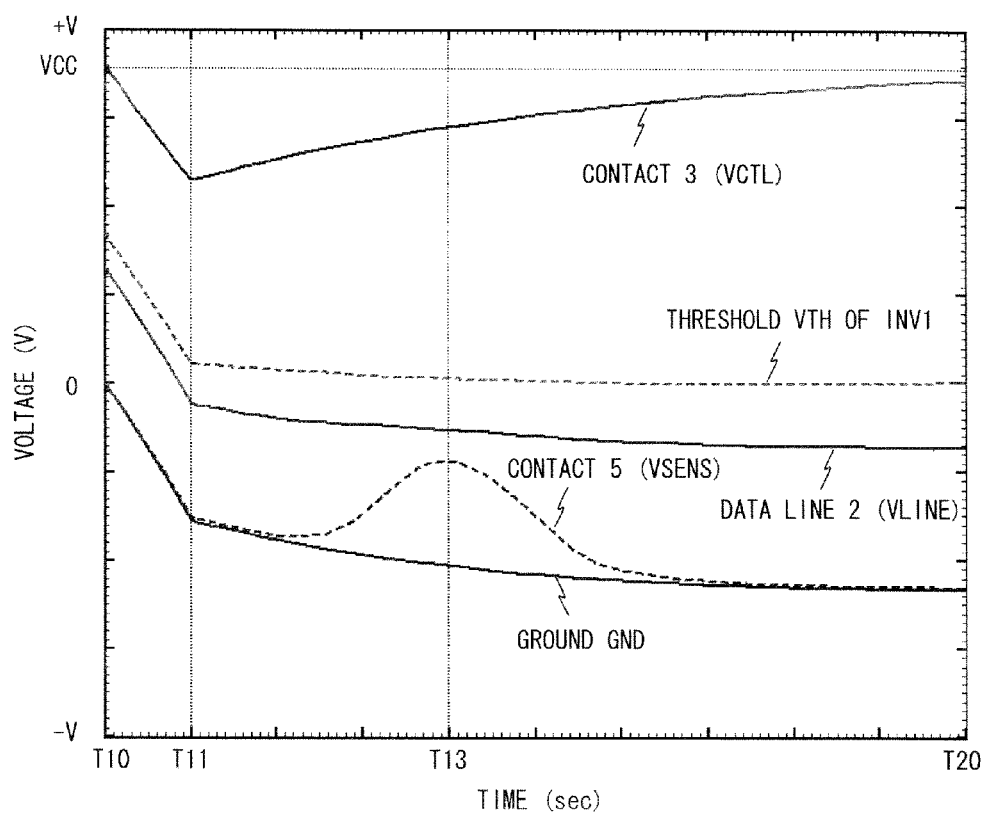
FIG. 10 is a waveform diagram showing an operation of the sense amplifier circuit according to the third embodiment.

FIG. 10 shows operational waveforms when the sense amplifier circuit according to this embodiment receives negative noise. FIG. 10 shows each signal of T10 to T20 when the negative noise occurs, as is similar to FIGS. 20 and 6.

First, assume a case in which the sense amplifier circuit 101 is in the reading mode state of the OFF cell. Then, at time T10, the potential of the ground GND and the potential of the contact 5 (VSENS) are 0 V, the potential of the data line 2 (VLINE) and the threshold of the inverter INV1 (VTH) are the intermediate potential between 0 V and the power supply VCC, and the potential of the contact 3 (VCTL) is the potential of the power supply VCC. For example, the potential of the contact 3 is 3.6 V, the potential of the data line 2 is 1.8 V, and the threshold of the inverter INV1 is 1.7 V (in the example shown in FIG. 9, the potential of the data line 2 is about 1.3 V).

Next, from time T10 to time T11, when negative noise occurs in the ground GND in the microcomputer (semiconductor device) in which the flash memory 202 is installed, the potential of the data line 2 (VLINE), the potential of the contact 3 (VCTL), the potential of the contact 5 (VSENS), and the threshold of the inverter INV1 (VTH) starts to change to the negative side −V while following the potential of the ground GND. For example, when the potential of the ground GND changes from 0 V to −1.5 V, the potential of the contact 3 changes from 3.6 V to 2.3 V, and the potential of the data line 2 and the threshold of the inverter INV1 change from 1.8 V to 0.2 V (in the example shown in FIG. 9, the potential of the data line 2 is about −0.2 V). Then, the potential of the contact changes from 0 V to −1.5 V.

Next, at time T11, only the potential of the contact 3 (VCTL) starts to return to the positive side +V, which increases the potential difference between the data line 2 and the contact 3. Then, Vgs, which is the potential difference between the gate and the source of the N type FET Q2 increases, and the current in the N type FET Q2 increases. The increased current also flows through the P type FET Q1 connected in series with the N type FET Q2. This also increases the current of the P type FET Q3 which forms a current mirror with the P type FET Q1, which increases the potential of the contact 5 (VSENS).

Next, at time T13, the potential of the contact 5 (VSENS) is in the peak. Even when the potential of the contact 5 (VSENS) is in the peak, the potential does not exceed the threshold of the inverter INV1 (VTH). In this embodiment, since the capacitance element C1 is connected to the contact 8 and the capacity of the capacitance element C1 is set based on the parasitic capacity CL in addition to the parasitic capacity CD, the potential of the contact 5 does not exceed the threshold of the inverter INV1. For example, when the potential of the ground GND is changed from −1.6 V to −2.0 V and the potential of the contact 3 is changed from 2.5 V to 2.7 V, the potential of the data line 2 and the threshold of the inverter INV1 are about 0 V (in the example shown in FIG. 9, the potential of the data line 2 is about −0.5 V). Meanwhile, the potential of the contact 5 is changed from 0 V to −1.0 V, and does not exceed the threshold of the inverter INV1.

In this way, in the sense amplifier circuit 101 according to this embodiment, even when the potential of the ground GND of the microcomputer that is installed changes to the negative side −V in the reading mode and the potential of the data line 2 decreases below "gate voltage of the N type FET−threshold", the amount of decrease is limited to a predetermined amount. Accordingly, there is no case in which erroneous data is output to the output terminal 6 when the OFF cell is read out.

The reason for this is that, since the capacitance element C1 is connected to the contact 8 and the capacity stated above is set, as shown in FIG. 10, at time T13, the potential difference between the data line 2 and the contact 3 increases by a predetermined amount, and Vgs, which is the potential difference between the gate and the source of the N type FET Q2 increases by a predetermined amount, which increases the current by a predetermined amount. The current of the P type FET Q1 connected in series with the N type FET Q2 also increases by a predetermined amount, and the current of the P type FET Q3 which forms a current mirror with the P type FET Q1 also increases by a predetermined amount. Further, even through the potential of the contact 5 increases, it does not exceed the threshold of the inverter INV1 since the amount of increase is limited to a predetermined amount. Thus, there is no case in which the ON cell is erroneously read out when the OFF cell should be read out.

As described above, in this embodiment, the capacity of the capacitance element C1 is set further in consideration of the parasitic capacity CL in the circuit configuration as is similar to the first embodiment. Accordingly, as is similar to the first embodiment, it is possible to prevent erroneous reading due to occurrence of noise and to suppress the size of the area of the capacitance element C1.

Fourth Embodiment

Hereinafter, with reference to the drawings, a fourth embodiment will be described. This embodiment is an example in which a fast charge function of an N type FET Q2 (sensing transistor) is added to the sense amplifier circuit according to the first embodiment. Other configurations are similar to those in the first embodiment. Further, the configuration of this embodiment may be applied to another embodiment.

Figure 11:
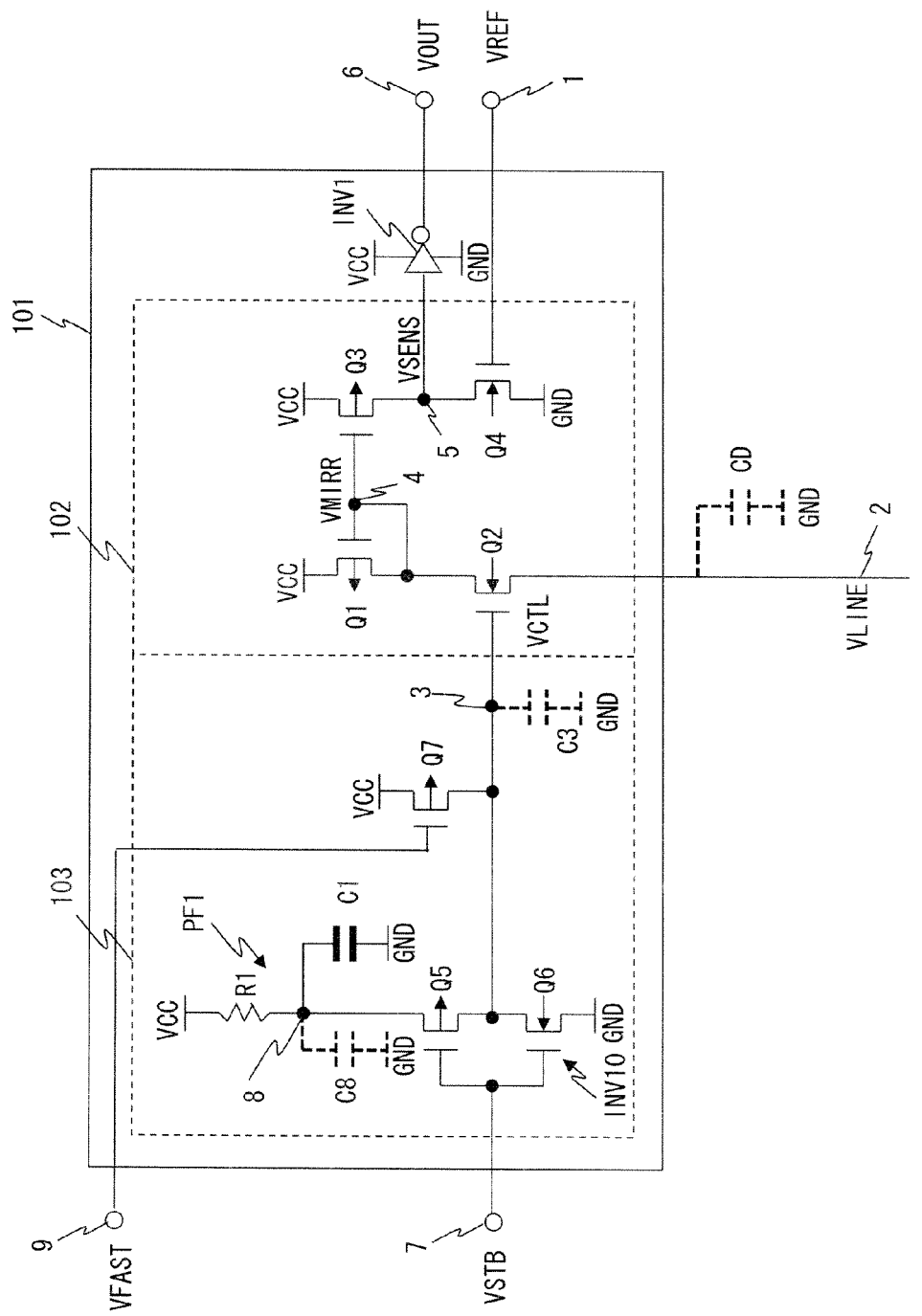
FIG. 11 is a circuit diagram showing a circuit configuration of a sense amplifier circuit according to a fourth embodiment.

FIG. 11 shows a configuration of a sense amplifier circuit according to this embodiment. A sense amplifier circuit 101 shown in FIG. 11 further includes a P type FET Q7 in addition to the sense amplifier circuit 101 shown in FIG. 2 of the first embodiment. The P type FET Q7 is a transistor to control fast charge of the gate of the N type FET Q2. The P type FET Q7 has a source connected to a power supply VCC, a gate connected to a fast charge control terminal 9 that receives a fast charge control signal VFAST, and a drain connected to the contact 3.

Figure 12:
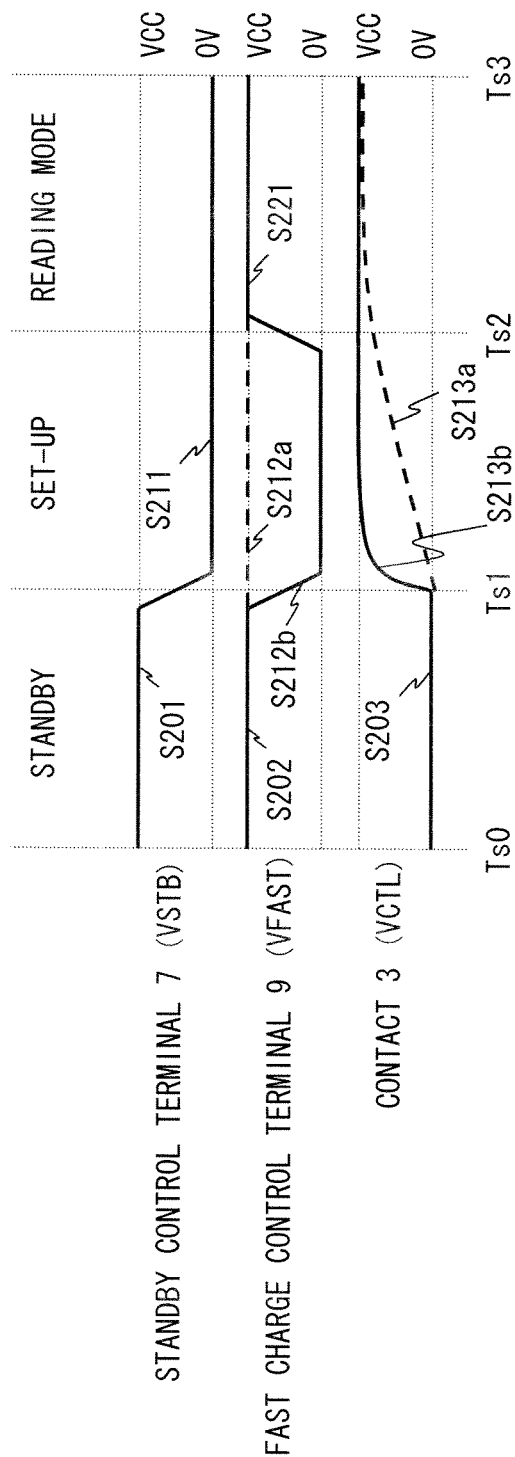
FIG. 12 is a timing chart showing an operation of the sense amplifier circuit according to the fourth embodiment.

FIG. 12 is a timing chart of the sense amplifier circuit according to this embodiment. Time Ts0 to Tm1 show each signal in a standby state, time Ts1 to Ts2 show each signal when reading is performed in a set-up state, and time Ts2 to Ts3 show each state when reading is performed in a normal reading mode state.

First, since the mode is the standby state at time Ts0, a high-level signal is input as the standby control signal VSTB and the fast charge control signal VFAST. Specifically, the potential of the standby control terminal 7 and the potential of the fast charge control terminal 9 are equal to the potential of the power supply VCC (S201, S202).

The standby control signal VSTB is inverted by the inverter INV10 to be the sense control signal VCTL. Further, the P type FET Q7 is turned off by the fast charge control signal VFAST. Accordingly, the potential of the contact 3 is 0 V, which is the inversion of the power supply VCC (S203). In this way, the sense amplifier circuit 101 is in the standby state.

Next, when fast charge is not performed at time Ts1, a low-level signal is input as the standby control signal VSTB and a high-level signal is input as the fast charge control signal VFAST (S211, S212a). Specifically, the P type FET Q7 is kept to be turned off by the fast charge control signal VFAST. When the potential of the standby control terminal 7 is changed to 0 V from the potential of the power supply VCC, the potential of the contact 3 (VCTL) is charged to the potential of the power supply VCC from 0 V through the resistance element R1 and the P type FET Q5 (S213a). In this way, the N type FET Q2 is able to read out the memory cell, and the sense amplifier circuit 101 is in the set-up state. In this case, the charge speed of the contact 3 is limited by the currents of the P type FET Q5 and the resistance element R1. Thus, the potential of the contact 3 is gradually increased.

Meanwhile, when the fast charge is performed at time Ts1, a low-level signal is input as the standby control signal VSTB and a low-level signal is input as the fast charge control signal VFAST (S211, S212b). Specifically, the P type FET Q7 is turned on by the fast charge control signal VFAST. When the potential of the standby control terminal 7 and the potential of the fast charge control terminal 9 are changed to 0 V from the potential of the power supply VCC, the potential of the contact 3 (VCTL) is charged from 0 V to the potential of the power supply VCC through a current path via the resistance element R1 and the P type FET Q5 and a current path via the P type FET Q7 from the power supply VCC (S213b). In this way, the N type FET Q2 is able to read the memory cell and the sense amplifier circuit 101 is in the set-up state. In this case, the charge speed of the contact 3 is limited by the currents of the resistance element R1 and the P type FET Q5 or the current of the P type FET Q7 which is greater. Accordingly, it is possible to perform fast charge so that the potential of the contact 3 (gate of the N type FET Q2) suddenly increases by the setting of the current of the P type FET Q7.

Next, at time Ts2, when a high-level signal is input as the fast charge control signal VFAST and the potential of the fast charge control terminal 9 changes from 0 V to the potential of the power supply VCC (S221), the state is the reading mode state. In the reading mode state, the operation is similar to that shown in FIG. 5 according to the first embodiment.

As described above, when the fast charge is not performed in the set-up state, the charge speed is limited since the resistance element R1 is set as a high pass filter. However, when the fast charge is performed in the set-up state, it is possible to control the charge speed since the P type FET Q7 can be set freely. Specifically, when the fast charge is performed, the current is set so that "current of the P type FET Q7>current of the resistance element R1", thereby being able to perform fast charge of the contact 3.

Fifth Embodiment

Hereinafter, with reference to the drawings, a fifth embodiment will be described. This embodiment is an example in which a function of switching a low-speed reading mode/a high-speed reading mode is added to the sense amplifier circuit according to the first embodiment. Other configurations are similar to those in the first embodiment. Further, the configuration of this embodiment may be applied to another embodiment.

Figure 13:
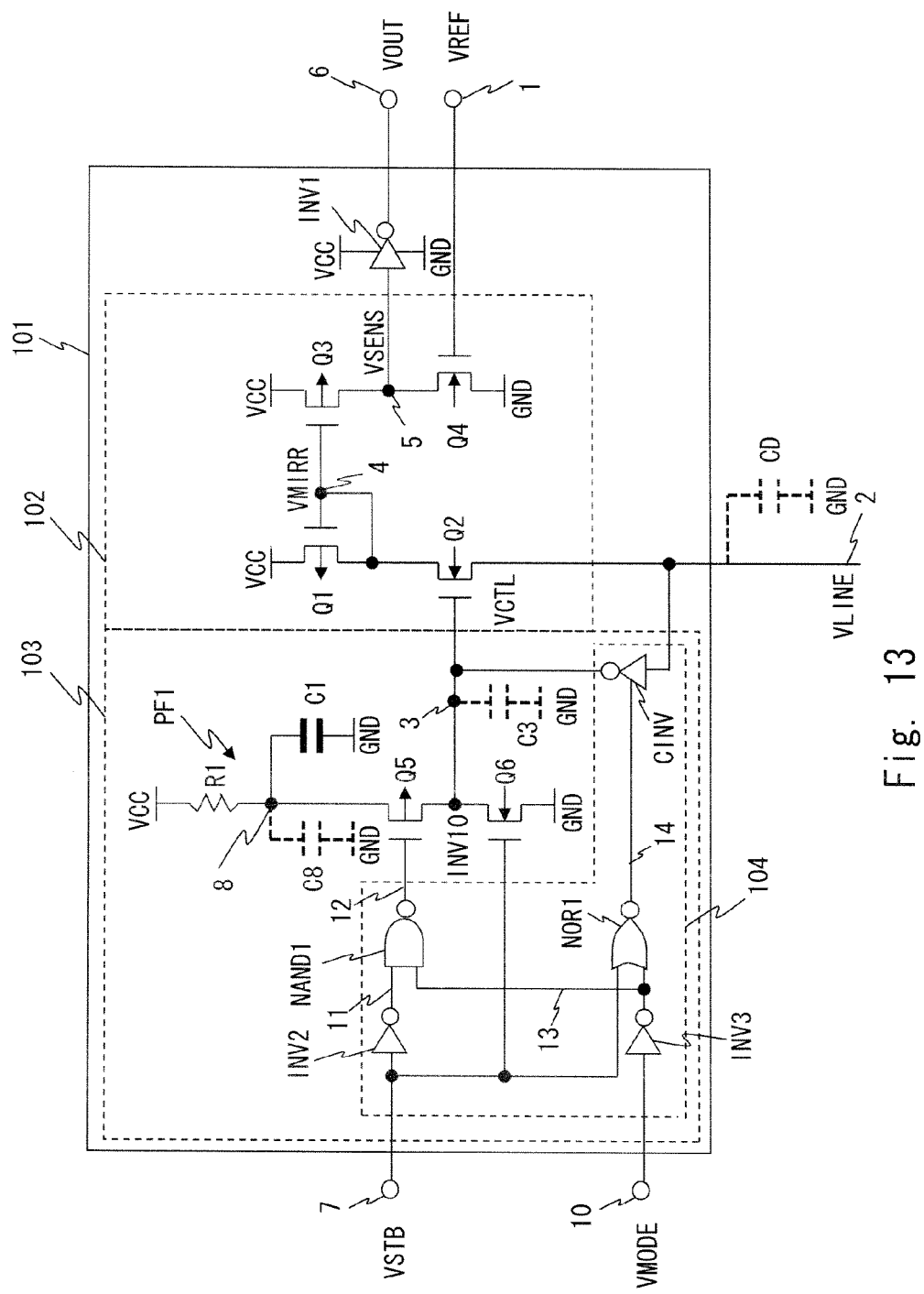
FIG. 13 is a circuit diagram showing a circuit configuration of a sense amplifier circuit according to a fifth embodiment.

FIG. 13 shows a configuration of a sense amplifier circuit according to this embodiment. In a sense amplifier circuit 101 shown in FIG. 13, a mode switching circuit 104 is added to the sense amplifier circuit 101 shown in FIG. 2.

The mode switching circuit 104 is a circuit that switches an operation mode of the sense amplifier circuit 101 to one of a standby mode, a low-speed reading mode, and a high-speed reading mode according to the standby control signal VSTB and a mode switch control signal VMODE. As shown in FIG. 13, the mode switching circuit 104 includes an inverter INV2, an inverter INV3, a NAND gate NAND1, a NOR gate NOR1, and a clocked inverter CINV.

The inverter INV2 has an input connected to the standby control terminal 7 that receives the standby control signal VSTB and an output connected to a contact 11 (one input end of the NAND gate NAND1). The inverter INV3 has an input connected to a mode switch control terminal 10 that receives the mode switch control signal VMODE and an output connected to a contact 13 (one input end of the NOR gate).

The NAND gate NAND1 has two input ends. One input end is connected to the contact 11, and the other input end is connected to the contact 13. An output of the NAND gate NAND1 is connected to a contact 12 (gate of the P type FETQ). The NOR gate NOR1 has two input ends. One input end is connected to the contact 13, and the other input end is connected to the standby control terminal 7. An output of the NOR gate NOR1 is connected to a contact 14 (control terminal of the clocked inverter CINV).

The clocked inverter CINV has a control input end connected to the contact 14, a signal input end connected to the data line 2, and an output end connected to the contact 3 (gate of the N type FET Q2).

FIG. 14 is an operational truth table of the sense amplifier circuit according to this embodiment. When the potential of the standby control terminal 7 (VSTB) is 0 V and the potential of the mode switch control terminal 10 (VMODE) is 0 V, the P type FET Q5 is turned on, the N type FET Q6 is turned off, and the clocked inverter CINV is rendered non-active. The potential of the contact 3 (VCTL) is equal to the potential of the power supply VCC since the P type FET Q5 is turned on. Accordingly, the state is the low-speed reading mode state in which the potential of the gate of the N type FET Q2 is fixed to the potential of the power supply VCC.

When the potential of the standby control terminal 7 (VSTB) is 0 V and the potential of the mode switch control terminal 10 (VMODE) is equal to the potential of the power supply VCC, the P type FET Q5 is turned off, the N type FET Q6 is turned off, and the clocked inverter CINV is rendered active. The potential of the contact 3 (VCTL) is the potential obtained by inverting and amplifying the data line 2 since the clocked inverter CINV is rendered active. Thus, the state is the high-speed reading mode state in which the gate of the N type FET Q2 is controlled to be amplified.

When the potential of the standby control terminal 7 (VSTB) is the potential of the power supply VCC and the potential of the mode switch control terminal 10 (VMODE) is 0 V or the potential of the power supply VCC, the P type FET Q5 is turned off, the N type FET Q6 is turned on, and the clocked inverter CINV is rendered non-active. The potential of the contact 3 (VCTL) becomes 0 V since the N type FET Q6 is turned on. Accordingly, the state is the standby state in which the potential of the gate of the N type FET Q2 is fixed to 0 V.

In this way, the mode switch control terminal 10 makes it possible to switch two states of the high-speed reading mode and the low-speed reading mode in which low power consumption and a low-voltage operation can be achieved. Further, it is possible to achieve the state with high noise immunity in the low-speed reading mode as is similar to the first embodiment.

The reason for it is that the impedance of the N type FET Q2 is varied in accordance with the current of the ON cell or the OFF cell by inverting and amplifying small amplitude of the potential of the data line 2 by the clocked inverter CINV and controlling the gate of the N type FET Q2 in the high-speed reading mode, thereby being able to change the potential of the contact 4 at a high speed.

In the low-speed reading mode, in the state in which the potential of the gate of the N type FET Q2 is fixed to the power supply VCC, there is no current path from the P type FET Q5. Thus, power consumption is reduced. Further, the potential of the gate of the N type FET Q2 can be kept to the potential of the power supply VCC only until when the potential of the contact 8 reaches the threshold of the P type FET Q5. Since there is no current path in the resistance element R1, the potential of the contact 8 is the same to the potential of the power supply VCC. Thus, the minimum operation voltage is the same to the logic gate, thereby being able to achieve a low-voltage operation. Further, the resistance element R1, the capacitance element C1, and the P type FET Q5 have the similar configuration and perform the same operations to the contact 3 as those in the first embodiment, thereby being able to achieve the state with high noise immunity.

Sixth Embodiment

Hereinafter, with reference to the drawings, a sixth embodiment will be described. This embodiment is an example in which the input of the standby control signal VSTB is omitted compared to the sense amplifier circuit according to the first embodiment. Other configurations are similar to those in the first embodiment. Further, the configuration of this embodiment may also be applied to another embodiment.

Figure 15:
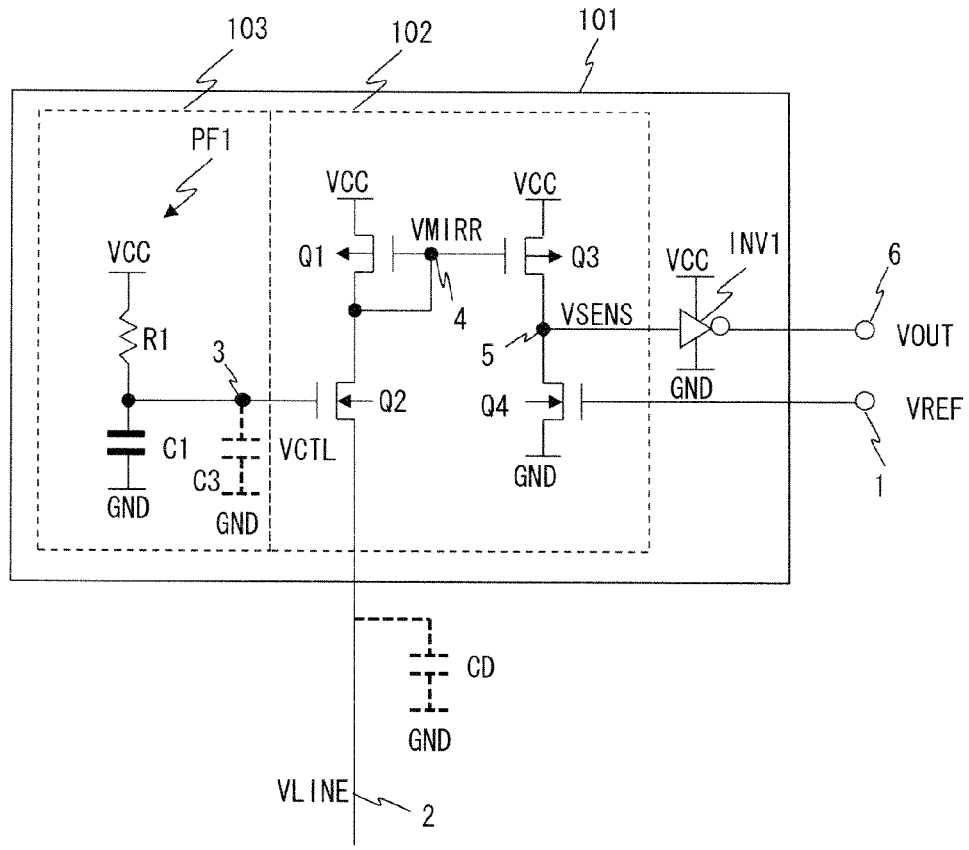
FIG. 15 is a circuit diagram showing a circuit configuration of a sense amplifier circuit according to a sixth embodiment.

FIG. 15 shows a configuration of a sense amplifier circuit according to this embodiment. A sense amplifier circuit 101 shown in FIG. 15 does not include the inverter INV10 as is different from the sense amplifier circuit 101 shown in FIG. 2. In this embodiment, as shown in FIG. 15, the resistance element R1 has one end connected to a power supply VCC and the other end connected to the contact 3 (gate of the N type FET Q2) and one end of the capacitance element C1. The capacitance element C1 has one end connected to the contact 3 and the other end of the resistance element R1, and the other end connected to a ground GND.

While the set values of the capacitance element C1 and the resistance element R1 are obtained in the similar way as in the first embodiment, there is no need to consider the parasitic capacity C8 shown in FIG. 2. Accordingly, the capacitance element C1 is expressed by the following expression 25, and the resistance element R1 is expressed by the following expression 26.

$$C1 = CD - C3 \qquad \text{expression (25)}$$

$$R1 = 1/\{2\pi \cdot f(C1 - C3)\} \qquad \text{expression (26)}$$

Figure 16:
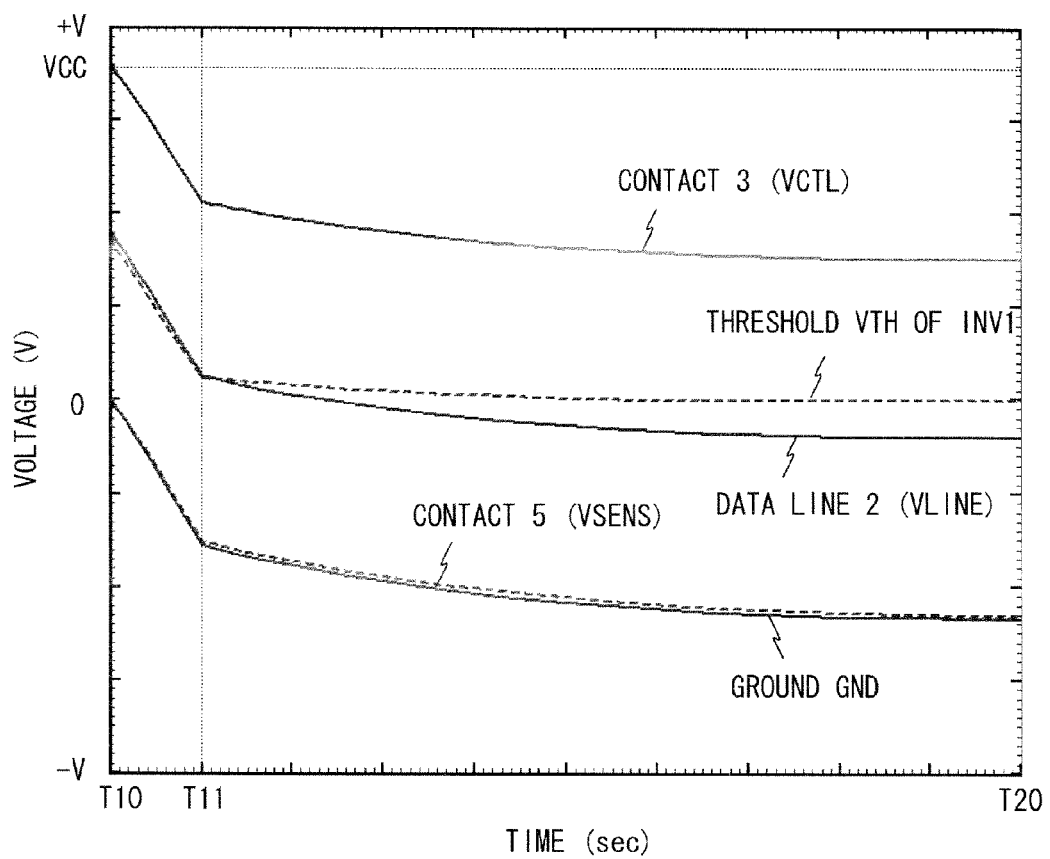
FIG. 16 is a waveform diagram showing an operation of the sense amplifier circuit according to the sixth embodiment.

FIG. 16 shows operational waveforms when the sense amplifier circuit 101 according to this embodiment receives negative noise. FIG. 16 shows each signal from T10 to T20 when the negative noise occurs, as is similar to FIGS. 20, 6 and the like.

First, assume that the sense amplifier circuit 101 is in the reading mode state of the OFF cell. In this case, at time T10, the potential of the ground GND and the potential of the contact 5 (VSENS) are 0 V, the potential of the data line 2 (VLINE) and the threshold of the inverter INV1 (VTH) are the intermediate potential between 0 V and the power supply VCC, and the potential of the contact 3 (VCTL) is the potential of the power supply VCC. For example, the potential of the contact 3 is 3.6 V, the potential of the data line 2 is 1.8 V, and the threshold of the inverter INV1 is 1.7 V.

Next, from time T10 to time T11, when negative noise occurs in the ground GND in a microcomputer (semiconductor device) in which the flash memory 202 is installed, the potential of the data line 2 (VLINE), the potential of the contact 3 (VCTL), the potential of the contact 5 (VSENS), and the threshold of the inverter INV1 (VTH) start to change to the negative side −V while following the potential of the ground GND.

Next, at time T11, the potential of the data line 2 (VLINE), the potential of the contact 3 (VCTL), the potential of the contact 5 (VSENS), and the threshold of the inverter INV1 (VTH) follow the potential of the ground GND. For example, when the potential of the ground GND is changed from 0 V to −1.6 V, the potential of the contact 3 is changed from 3.6 V to 2.1 V, the potential of the data line 2 is changed from 1.8 V to 0.2 V, the threshold of the inverter INV1 is changed from 1.7 V to 0.2 V, the potential of the contact 5 is changed from 0 V to −1.6 V, and the potential difference between the threshold of the inverter INV1 and the contact 5 is kept to 1.8 V.

In this embodiment, the capacitance element C1 is connected to the contact 3, and as is similar to the first embodiment, the influence at the time of occurrence of the negative noise is made equal between the data line 2 and the contact 3. Thus, the potential of the contact 5 does not exceed the threshold of the inverter INV1.

Accordingly, even at time T11 and after time T11, the potential of the data line 2 (VLINE), the potential of the contact 3 (VCTL), the potential of the contact 5 (VSENS), and the threshold of the inverter INV1 (VTH) follow the potential of the ground GND, and continue to follow until time T20.

Further, the potentials at time T20 are as follows. For example, when the potential of the ground GND is changed from −1.6 V to −2.4 V, the potential of the contact 3 is changed from 2.1 V to 1.6 V, the potential of the data line 2 is changed to −0.4 V, the threshold of the inverter INV1 is changed from 0.2 V to 0 V, the potential of the contact 5 is changed from −1.6 V to −2.4 V, and the potential difference between the threshold of the inverter INV1 and the contact 5 is kept to 2.4 V.

As stated above, with the use of the sense amplifier circuit 101 according to this embodiment, even when the potential of the ground GND of the microcomputer that is installed is changed to the negative side −V, the potential of the data line 2 does not decrease below "gate voltage of the N type FET−threshold". Accordingly, there is no case in which erroneous data is output to the output terminal 6 when the OFF cell is read out.

The reason for it is that, since the capacitance element C1 is connected to the contact 3 and the capacity stated above is set, as shown in FIG. 16, even at time T11 and after time T11, the potential difference between the data line 2 and the contact 3 is constant, which means Vgs, which is the potential difference between the gate and the source of the N type FET Q2 is also constant and there is no current change. There is no current change in the P type FET Q1 connected in series with the N type FET Q2, and also there is no current change in the P type FET Q3 that forms a current mirror with the P type FET Q1. Further, the potential of the contact 5 only follows the potential of the ground GND and does not exceed the threshold of the inverter INV1. Accordingly, it is possible to prevent such a state in which the ON cell is erroneously read out when the OFF cell should be read out.

Seventh Embodiment

Hereinafter, with reference to the drawings, a seventh embodiment will be described. This embodiment is an example in which the configuration of the output stage of the sense circuit 102 is changed compared to the sense amplifier circuit according to the sixth embodiment. Other configurations are similar to those of the sixth embodiment. Further, the configuration of this embodiment may be applied to another embodiment.

Figure 17:
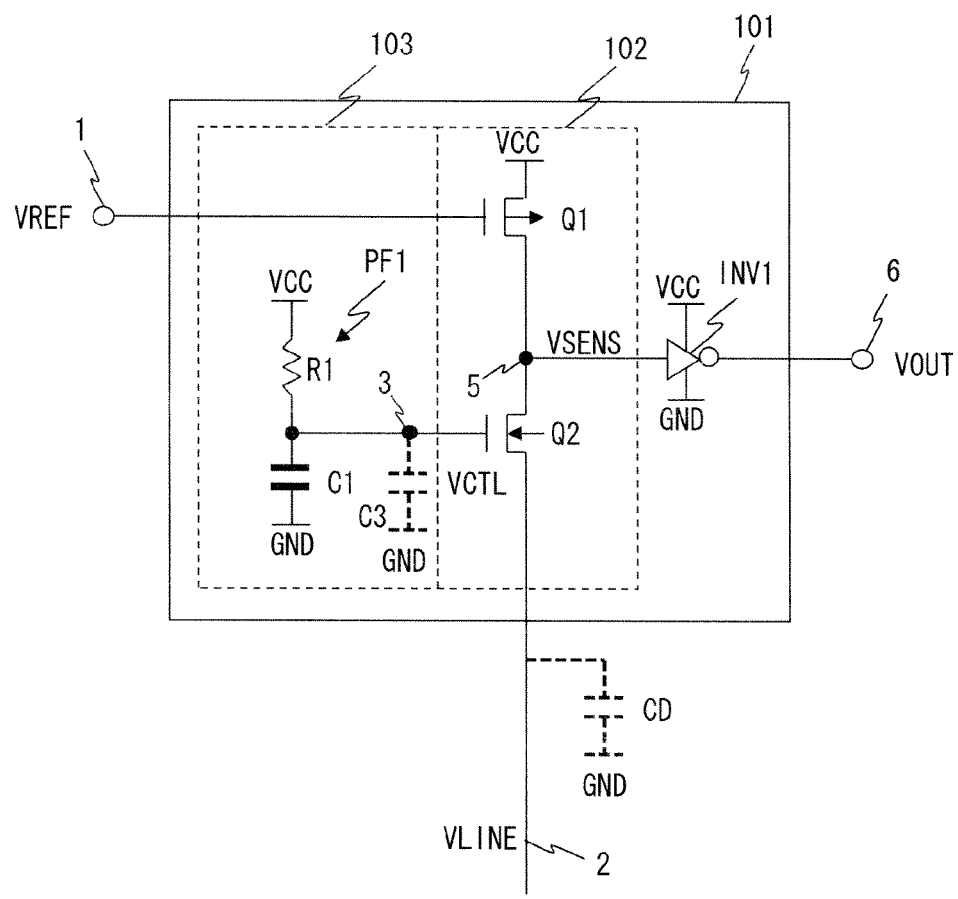
FIG. 17 is a circuit diagram showing a circuit configuration of a sense amplifier circuit according to a seventh embodiment.

FIG. 17 shows a configuration of a sense amplifier circuit according to this embodiment. A sense amplifier circuit 101 shown in FIG. 17 is different from the sense amplifier circuit 101 shown in FIG. 15 in that the sense amplifier circuit 101 shown in FIG. 17 does not include the P type FET Q3 and the N type FET Q4 and the reference voltage VREF is input to the P type FET Q1.

Specifically, as shown in FIG. 17, the sense circuit 102 includes a P type FET Q1 and an N type FET Q2 connected in series between a power supply VCC and the data line 2. The P type FET Q1 has a gate connected to the reference voltage input terminal 1, a source connected to the power supply VCC, and a drain connected to the contact 5 (output terminal of the sense circuit 102). The N type FET Q2 has a gate connected to the contact 3 (intermediate between the resistance element R1 and the capacitance element C1), a drain connected to the drain (contact 5) of the P type FET Q1, and a source connected to the data line 2. In summary, the P type FET Q1 and the N type FET Q2 are connected to the inverter INV1 by the path including the node between the P type FET Q1 and the N type FET Q2.

As shown in this embodiment, even when the configuration of the sense circuit is changed to another circuit configuration which is different from the current mirror as shown in the sixth embodiment and the like, the similar effect can be achieved. In summary, it is only required that the sensing transistor (N type FET Q2) is connected to the data line 2 and the resistance element R1 and the capacitance element C1 are connected to the contact 3. By setting the capacity of the capacitance element C1 based on the parasitic capacity CD, it is possible to prevent erroneous reading due to occurrence of noise.

While the present invention made by the present inventors has been specifically described based on the embodiments, it is needless to say that the present invention is not limited to the embodiments stated above but may be changed in various ways without departing from the spirit of the present invention.

For example, while the sense amplifier circuit of the flash memory has been described in the embodiments described above, other non-volatile memories such as a ROM or volatile memories such as an SRAM and a DRAM may be used in place of the flash memory.

The first to seventh embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A sense amplifier circuit comprising:
   a sensing transistor that is connected between a first power supply and a second power supply through a memory cell connection line that extends to a memory cell;
   a resistance element that is connected between the first power supply and a control terminal of the sensing transistor; and
   a capacitance element that is connected between the second power supply and the control terminal of the sensing transistor, wherein
   a first capacity from the sensing transistor to the second power supply through the capacitance element is equal to a second capacity from the sensing transistor to the second power supply through the memory cell connection line.

2. The sense amplifier circuit according to claim 1, wherein the first capacity is a capacity in which a capacity of the capacitance element, a parasitic capacity of the sensing transistor, and a whole parasitic capacity of a capacitor line that connects from the capacitance element to the sensing transistor are added.

3. The sense amplifier circuit according to claim 2, wherein the capacitor line connects the sensing transistor and the capacitance element by a path that includes connection with an input control transistor, and
   the whole parasitic capacity of the capacitor line is a capacity in which a parasitic capacity of a line from the sensing transistor to the capacitance element and a parasitic capacity of the input control transistor are added.

4. The sense amplifier circuit according to claim 1, wherein the second capacity is a capacity in which a parasitic capacity of the sensing transistor, a whole parasitic capacity of the memory cell connection line, and a parasitic capacity of the memory cell are added.

5. The sense amplifier circuit according to claim 4, wherein the memory cell connection line connects the sensing transistor and the memory cell through a column selection unit that selects a column of the memory cell, and
   the whole parasitic capacity of the memory cell connection line is a capacity in which a parasitic capacity of a data line from the sensing transistor to the column selection circuit, a parasitic capacity of the column selection circuit, and a parasitic capacity of a bit line from the column selection circuit to the memory cell are added.

6. The sense amplifier circuit according to claim 1, wherein a resistance value of the resistance element is a value based on the first capacity and a frequency of noise whose potential is changed to a potential side of the second power supply.

7. The sense amplifier circuit according to claim 1, wherein the capacitance element is formed of a MOS transistor, and
   a capacity of the capacitance element is a gate capacity of the MOS transistor.

8. The sense amplifier circuit according to claim 1, wherein the capacitance element includes two lines that are extended in parallel with an interval therebetween on an identical wiring layer in a semiconductor device including the sense amplifier circuit, and
   a capacity of the capacitance element is a capacity of an insulation film between the two lines.

9. The sense amplifier circuit according to claim 1, wherein
the capacitance element includes an upper line of an upper wiring layer and a lower line of a lower wiring layer in a semiconductor device including the sense amplifier circuit, and
a capacity of the capacitance element is a capacity of an insulation film between the upper line and the lower line.

10. A sense amplifier circuit comprising:
a sensing transistor that is connected between a first power supply and a second power supply through a memory cell connection line that extends to a memory cell;
a resistance element that is connected between the first power supply and a control terminal of the sensing transistor;
a capacitance element that is connected between the second power supply and the control terminal of the sensing transistor; and
a current-mirror circuit that mirrors a current flowing through the sensing transistor, wherein
a first capacity from the sensing transistor to the second power supply through the capacitance element is based on a second capacity from the sensing transistor to the second power supply through the memory cell connection line and a third capacity of a circuit in an output side of the current-mirror circuit.

11. The sense amplifier circuit according to claim 10, wherein the third capacity is a capacity in which a parasitic capacity of an output-side transistor of the current-mirror circuit, a whole parasitic capacity of an output line from the output-side transistor to an output inverter which is an output circuit of the sense amplifier circuit, and a parasitic capacity of the output inverter are added.

12. The sense amplifier circuit according to claim 11, wherein
the output line connects the output-side transistor and the output inverter by a path that includes connection with an output control transistor, and
the whole parasitic capacity of the output line is a capacity in which a parasitic capacity of a line from the output-side transistor to the output inverter and a parasitic capacity of the output control transistor are added.

* * * * *